(12) United States Patent
Tonomura et al.

(10) Patent No.: US 9,024,412 B2
(45) Date of Patent: May 5, 2015

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventors: Fumio Tonomura, Kanagawa (JP); Hideo Ishii, Kanagawa (JP); Tsuyoshi Ota, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/952,869

(22) Filed: Jul. 29, 2013

(65) Prior Publication Data

US 2014/0070319 A1 Mar. 13, 2014

(30) Foreign Application Priority Data

Sep. 10, 2012 (JP) .................................. 2012-198568

(51) Int. Cl.
*H01L 27/02* (2006.01)
*H01L 27/06* (2006.01)
*H01L 23/34* (2006.01)
*H01L 23/482* (2006.01)

(52) U.S. Cl.
CPC ............ *H01L 27/0676* (2013.01); *H01L 23/34* (2013.01); *H01L 27/0211* (2013.01); *H01L 27/0629* (2013.01); *H01L 23/4824* (2013.01); *H01L 2924/0002* (2013.01)

(58) Field of Classification Search
CPC ................ H01L 29/0696; H01L 2924/13055; H01L 29/732; H01L 29/7395; H01L 33/38
USPC ........ 257/106, 175, 176, 199, 471, 544, 546, 257/551, 603, 605, E29.327, E29.335, 257/E21.355, E21.356; 438/91, 137, 138, 438/173, 380, 983
See application file for complete search history.

(56) References Cited

U.S. PATENT DOCUMENTS

| | | | |
|---|---|---|---|
| 5,629,542 A | 5/1997 | Sakamoto et al. | |
| 6,605,842 B2 * | 8/2003 | Hoshino et al. | 257/339 |
| 7,211,861 B2 * | 5/2007 | Teramae et | 257/330 |
| 2001/0009287 A1 * | 7/2001 | Fujihira et al. | 257/328 |
| 2002/0050602 A1 * | 5/2002 | Narazaki | 257/106 |
| 2004/0248330 A1 * | 12/2004 | Kitabatake et al. | 438/17 |
| 2005/0023658 A1 * | 2/2005 | Tabira et al. | 257/678 |
| 2009/0114985 A1 * | 5/2009 | Akagi et al. | 257/334 |
| 2011/0084335 A1 * | 4/2011 | Lin et al. | 257/334 |
| 2012/0091555 A1 * | 4/2012 | Nakasaki | 257/522 |

FOREIGN PATENT DOCUMENTS

| | | |
|---|---|---|
| JP | 2004-31980 A | 1/2004 |
| JP | 2007-95848 A | 4/2007 |

\* cited by examiner

*Primary Examiner* — Eduardo A Rodela
(74) *Attorney, Agent, or Firm* — Sughrue Mion, PLLC

(57) ABSTRACT

A first MOSFET is formed in a first region of a chip, and a second MOSFET is formed in a second region thereof. A first source terminal and a first gate terminal are formed in the first region. In the second region, a second source terminal and a second gate terminal are arranged so as to be aligned substantially parallel to a direction in which the first source terminal and the first gate terminal are aligned. A temperature detection diode is arranged between the first source terminal and the second source terminal. A first terminal and a second terminal of the temperature detection diode are aligned in a first direction substantially parallel to a direction in which the first source terminal and the first gate terminal are aligned or in a second direction substantially perpendicular thereto.

20 Claims, 31 Drawing Sheets

SEMICONDUCTOR DEVICE AND METHOD OF MANUFACTURING THE SAME

CROSS-REFERENCE TO RELATED APPLICATION

The disclosure of Japanese Patent Application No. 2012-198568 filed on Sep. 10, 2012 including the specification, drawings and abstract is incorporated herein by reference in its entirety.

BACKGROUND

The present invention relates to a semiconductor device and a method of manufacturing the same, and to a semiconductor device having a vertical transistor structure and a method of manufacturing the semiconductor device.

In recent years, a high-capacity and small-sized Li-ion (lithium-ion) battery has been used in various products including cell phones and notebook PCs. Although the Li-ion battery has high performance, heat generation and deterioration due to overcharge, overdischarge, short circuit or the like are likely to occur therein, and a problem such as burst arises depending on a case. A protection circuit is needed in order to safely use the Li-ion battery. Therefore, in a battery pack, there is provided a protection circuit substrate that monitors overcharge, overdischarge, overcurrent, abnormal heat generation and the like, and controls charge and discharge.

The protection circuit substrate is provided with a MOSFET (Metal-Oxide-Semiconductor Field-Effect Transistor), a resistor, a temperature detection element and a control IC. The MOSFET switches ON/OFF a charge path and a discharge path. As the MOSFET, there is used, for example, a bidirectional MOSFET in which two FETs having a common drain electrode are formed into one chip. The resistor detects a charge and discharge current. The temperature detection element detects temperatures of the MOSFET and the protection circuit substrate, and, for example, a thermistor or the like is used as a temperature detection element. The control IC processes information from these elements, and controls the MOSFET.

With the progress of size reduction and price reduction of cell phones and notebook PCs, size reduction, thickness reduction, and price reduction are required also for the protection circuit substrate. In such a situation, a technology of mounting a temperature detection element on a MOSFET is been proposed. In Japanese Patent Laid-Open No. 2004-31980 (Patent Document 1), a temperature detection element is provided at a position adjacent to a source pad over an active region having a highest temperature over a region where a power MOSFET is formed. This temperature detection element is coupled to a control circuit formation region in a same chip, and a detection signal cannot be extracted outside.

Japanese Patent Laid-Open No. 2007-95848 (Patent Document 2) describes a technology in which two bipolar transistors coupled to gates of two output MOSFETs, respectively are provided, and in which overheated states of the output MOSFETs are detected by detecting leakage currents of the respective bipolar transistors.

SUMMARY

In Patent Document 2, since the bipolar transistors are coupled to the gates of the output MOSFETs, a capacity coupled to the gates increases. Because of this, there is a possibility that the output MOSFETs are affected by the bipolar transistors, and that operating speeds thereof become slow.

The other problems and the new feature will become clear from the description of the present specification and the accompanying drawings.

According to one embodiment, in a semiconductor device, there is arranged a temperature detection diode between a first source terminal of the first MOSFET formed in a first region and a second source terminal of the second MOSFET formed in a second region of a chip. A direction in which a first terminal and a second terminal of the temperature detection diode are aligned is a first direction substantially parallel to a direction in which the first source terminal and a first gate terminal of the first MOSFET are aligned, or a second direction substantially perpendicular thereto.

According to the present embodiment, it becomes possible to perform temperature detection without affecting operation of the MOSFETs.

DETAILED DESCRIPTION

The present embodiment relates to a semiconductor device and a method of manufacturing the semiconductor device, and relates to, for example, a semiconductor device that has a charge and discharge control MOSFET of a Li-ion battery in which two MOFETs having a common drain electrode are formed into one chip or that has a similar vertical transistor structure, and a method of manufacturing the same.

The semiconductor device according to the present embodiment is, for example, a CSP (Chip size package) type MOSFET having a pad provided over a chip, and is flip-chip mounted. A temperature detection diode is incorporated in the MOSFET, and cost reduction, size reduction, and thickness reduction of a protection circuit substrate on which the MOSFET is mounted can be achieved.

In addition, in consideration of terminal arrangement, element arrangement, and an element structure of the temperature detection diode in the semiconductor device, a most suitable layout is provided in order to solve a problem of an increasing chip size. Because of this, it becomes possible to accurately detect heat generation of the MOSFET simultaneously with the cost reduction, size reduction, and thickness reduction of the protection circuit substrate, and thus a small and safer battery pack can be achieved. Hereinafter, a specific configuration of the present embodiment will be explained.

First Embodiment

Figure 1:
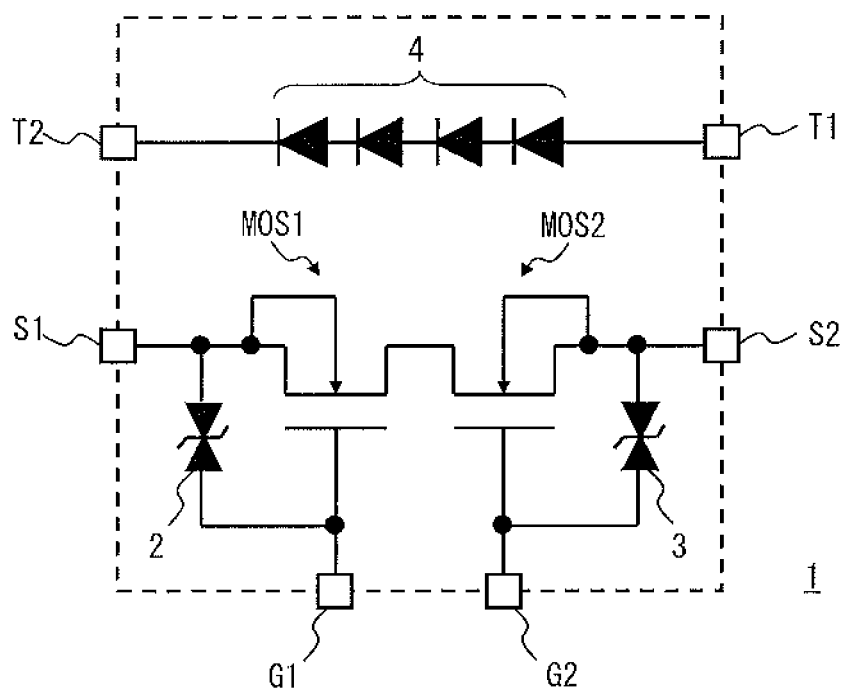
FIG. 1 is a circuit diagram showing a configuration of a semiconductor device according to a First Embodiment.

A semiconductor device according to a First Embodiment will be explained with reference to drawings. In the following drawings, the same symbol is attached to the same component, and explanation thereof is appropriately omitted. FIG. 1 is a circuit diagram showing a configuration of a semiconductor device 1 according to the First Embodiment. As shown in FIG. 1, the semiconductor device 1 is provided with two N-channel-type MOSFETs (hereinafter referred to as a MOS1 and a MOS2), Zener diodes 2 and 3, and a temperature detection diode 4.

A drain is coupled in common to the MOS1 and the MOS2. A source of the MOS1 is coupled to a source terminal S1, and a gate thereof is coupled to a gate terminal G1. A source of the MOS2 is coupled to a source terminal S2, and a gate thereof is coupled to a gate terminal G2. Note that the MOS1 and the MOS2 may be P-channel-type MOSFETs.

In the First Embodiment, the temperature detection diode 4 has a configuration in which a plurality of diode elements has been coupled in series. Although the temperature detection diode 4 includes four-stage diode element in an example shown in FIG. 1, the appropriate number of stages can be selected depending on an external application. An anode of the temperature detection diode 4 is coupled to an anode terminal T1 (a first terminal), and a cathode thereof is coupled to a cathode terminal T2 (a second terminal). The temperature detection diode 4 is not coupled to any of the MOS1 and the MOS2 in the semiconductor device 1. Therefore, it becomes possible to perform temperature detection without affecting operation of the MOSFETs in the First Embodiment.

The bidirectional Zener diodes 2 and 3 for gate protection are provided between the gates and the sources of the MOS1 and the MOS2, respectively. Note that, although the bidirectional Zener diodes 2 and 3 respectively include one-stage diode element in the example shown in FIG. 1, plural stages of diode elements may be coupled in some cases in accordance with a withstand voltage of a MOSFET to be protected. Note that a bidirectional Zener diode may not be provided.

Figure 2:
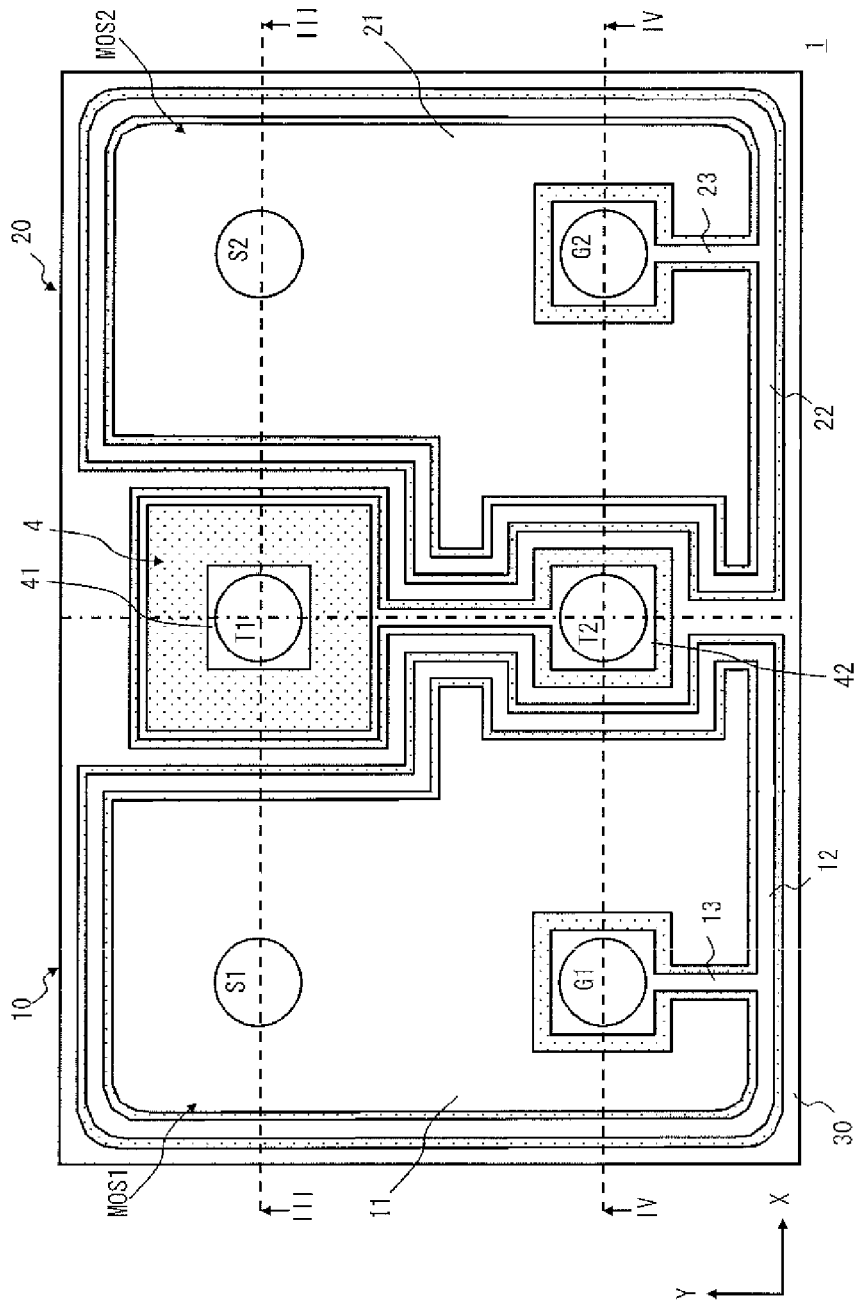
FIG. 2 is a diagram showing a surface layout of the semiconductor device shown in FIG. 1.

A layout of a chip surface of the semiconductor device 1 according to the First Embodiment is shown in FIG. 2. As shown in FIG. 2, the chip is divided into a first region 10 and a second region 20. In FIG. 2, a boundary line of the first region 10 and the second region 20 is shown by a dashed line. The MOS1 is formed in the first region 10, and the MOS2 is formed in the second region 20. The source terminal S1 and the gate terminal G1 which have been coupled to the MOS1 are arranged in the first region 10. The source terminal S2 and the gate terminal G2 which have been coupled to the MOS2 are arranged in the second region 20. A direction in which the source terminal S1 and the gate terminal G1 are aligned, and a direction in which the source terminal S2 and the gate terminal G2 are aligned are substantially parallel to each other. Here, the direction in which the source terminal S1 and the gate terminal G1 are aligned, and the direction in which the source terminal S2 and the gate terminal G2 are aligned are defined as a Y direction (a first direction).

The source terminal S1 and the source terminal S2 are arranged facing each other while sandwiching the boundary of the first region 10 and the second region 20. The gate terminal G1 and the gate terminal G2 are arranged facing each other while sandwiching the boundary of the first region 10 and the second region 20. A direction in which the source terminal S1 and the source terminal S2 are aligned, and a direction in which the gate terminal G1 and the gate terminal G2 are aligned are substantially parallel to each other. Here, the direction in which the source terminal S1 and the source terminal S2 are aligned, and the direction in which the gate terminal G1 and the gate terminal G2 are aligned are defined as an X direction (a second direction). The temperature detection diode 4 is arranged between the source terminal S1 and the source terminal S2. The temperature detection diode 4 is arranged between the first region 10 where the MOS1 is formed, and the second region 20 where the MOS2 is formed.

The anode terminal T1 and the cathode terminal T2 of the temperature detection diode 4 are arranged between the first region 10 and the second region 20. The anode terminal T1 and the cathode terminal T2 are arranged so as to be aligned in the Y direction (the first direction).

The anode terminal T1 is arranged between the source terminal S1 and the source terminal S2. That is, the source terminal S1, the anode terminal T1, and the source terminal S2 are arranged so as to be aligned in this order in the X direction (second direction).

The anode terminal T1 is arranged at an intersection of a straight line that passes through the source terminal S1 and the source terminal S2, and the boundary line of the first region 10 and the second region 20. A distance between the source terminal S1 and the anode terminal T1, and a distance between the source terminal S2 and the anode terminal T1 are substantially equal to each other. The temperature detection diode 4 is laid out in a lower portion of the anode terminal T1, with the intersection of the straight line that passes through the source terminal S1 and the source terminal S2, and the boundary line of the first region 10 and the second region 20 being as a center.

The cathode terminal T2 is arranged between the gate terminal G1 and the gate terminal G2. That is, the gate terminal G1, the cathode terminal T2, and the gate terminal G2 are arranged so as to be aligned in this order in the X direction (the second direction). A distance between the gate terminal G1 and the cathode terminal T2, and a distance between the gate terminal G2 and the cathode terminal T2 are substantially equal to each other.

A distance between the source terminal S1 and the gate terminal G1, a distance between the anode terminal T1 and the cathode terminal T2, and a distance between the source terminal S2 and the gate terminal G2 are substantially equal to one another. The source terminals S1 and S2, the gate terminals G1 and G2, the anode terminal T1, and the cathode terminal T2 are respectively fixed to a protection circuit substrate by solder or the like, and are connected. Deviation of a connecting position of the semiconductor device when melting of solder by heat causes connection can be suppressed by equalizing a pitch of the terminals.

A source aluminum wiring 11 of the MOS1 is laid out over a surface of the first region 10, and a source aluminum wiring 21 of the MOS2 is laid out over a surface of the second region 20. A plurality of cells of the MOSFET is arranged under these wirings. A gate aluminum wiring 12 is arranged at an outer periphery of the source aluminum wiring 11 so as to surround the source aluminum wiring 11. The gate aluminum wiring 12 is coupled to the gate terminal G1 by a leader line 13.

A gate aluminum wiring 22 is arranged at an outer periphery of the source aluminum wiring 21 so as to surround the source aluminum wiring 21. The gate aluminum wiring 22 is coupled to the gate terminal G2 by a leader line 23. A separation wiring 30 is arranged at outer peripheries of the gate aluminum wiring 12 and the gate aluminum wiring 22. The separation wiring 30 is a ring-shaped wiring also referred to as an EQR (EQui-potential Ring). By keeping the separation wiring 30 at a drain potential, the spread of a depletion layer is suppressed so that the depletion layer does not reach an edge of the chip, and a withstand voltage of the chip edge can be maintained.

An anode wiring 41 is formed at the lower portion of the anode terminal T1, and a cathode wiring 42 is formed at a lower portion of the cathode terminal T2. The cathode wiring 42 is drawn so as to surround the periphery of the anode wiring 41. A drain electrode that is not shown in FIG. 2 is provided on a back surface of the semiconductor device 1. This drain electrode is shared by the MOS1 and the MOS2.

Figure 3:
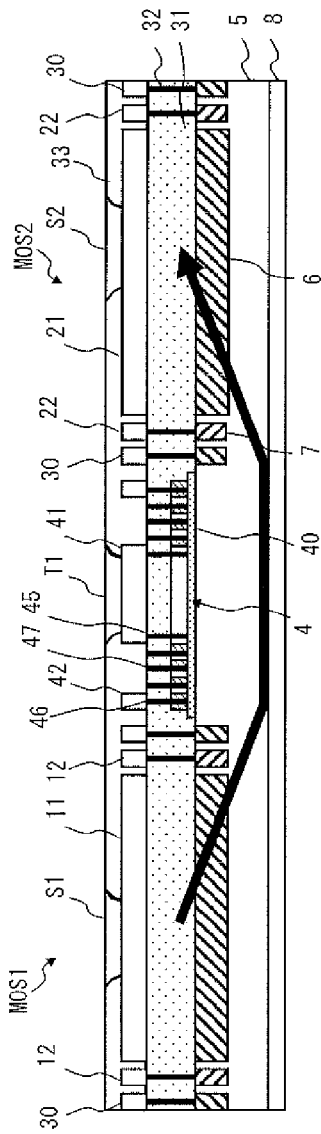
FIG. 3 is a cross-sectional diagram of the semiconductor device taken along a line shown in FIG. 2.
Figure 4:
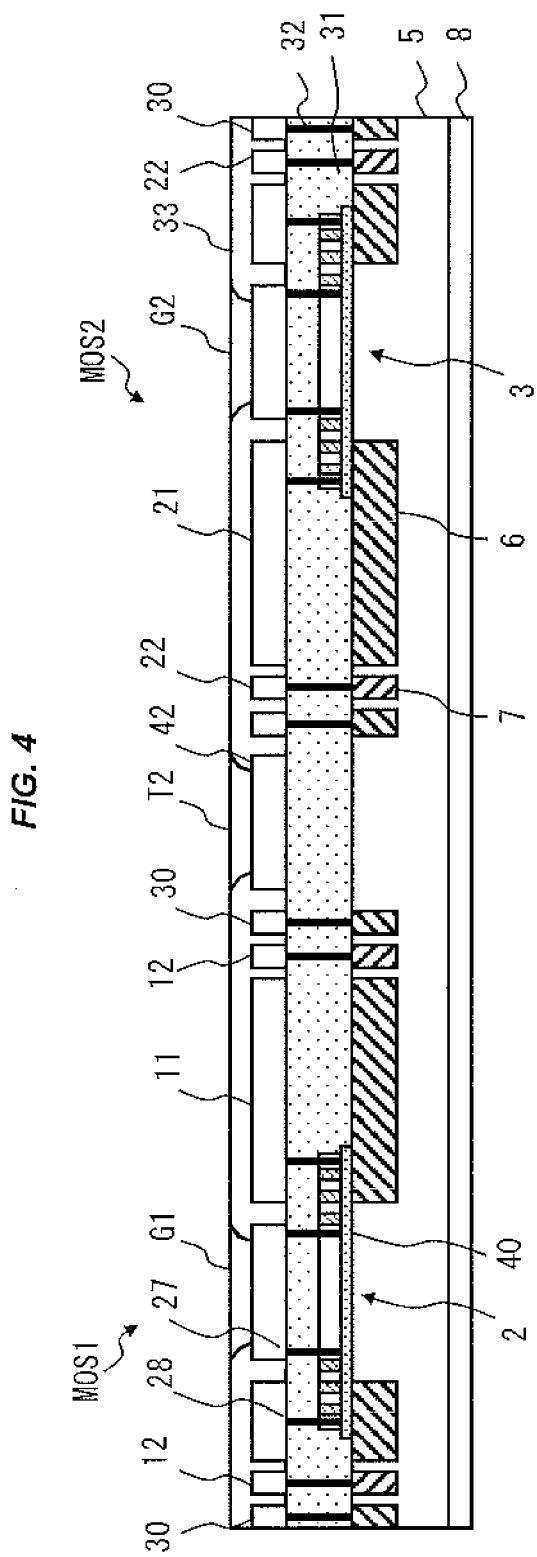
FIG. 4 is a cross-sectional diagram of the semiconductor device taken along a line IV-IV shown in FIG. 2.

Here, a cross-sectional structure of the semiconductor device 1 will be explained with reference to FIGS. 3 and 4. FIG. 3 is a cross-sectional view taken along a line of FIG. 2, and FIG. 4 is a cross-sectional view taken along a line IV-IV of FIG. 2. As shown in FIG. 3, the semiconductor device 1 further has a semiconductor substrate 5, a base region 6, a gate trench 7, a drain electrode 8, an interlayer insulating film 31, a contact 32, a protective insulating film 33 and the like.

The semiconductor substrate 5 is, for example, an N-type semiconductor substrate including Si. An N-type epitaxial region that is not shown is formed at the semiconductor substrate 5. The semiconductor substrate 5 and the epitaxial region work as a drain region. The P-type base region 6 and the gate trench 7 are formed at the semiconductor substrate 5. The base region 6 works as a channel region. The gate trench 7 and a source region, although not shown, are formed in the base region 6. A gate electrode, which includes polysilicon and the like, and a gate insulating film which are not shown, are formed in the gate trench 7. Furthermore, an interlayer insulating film and the like may be formed in the gate trench 7. On the whole, a vertical transistor structure is formed under both regions where the source aluminum wiring 11 and the source aluminum wiring 21 have been formed.

Figure 5:
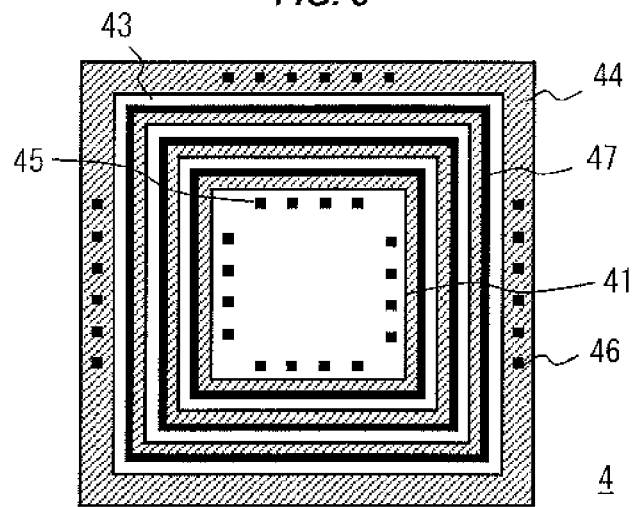
FIG. 5 is a diagram showing a configuration of a temperature detection diode used for the semiconductor device shown in FIG. 2.
Figure 6:
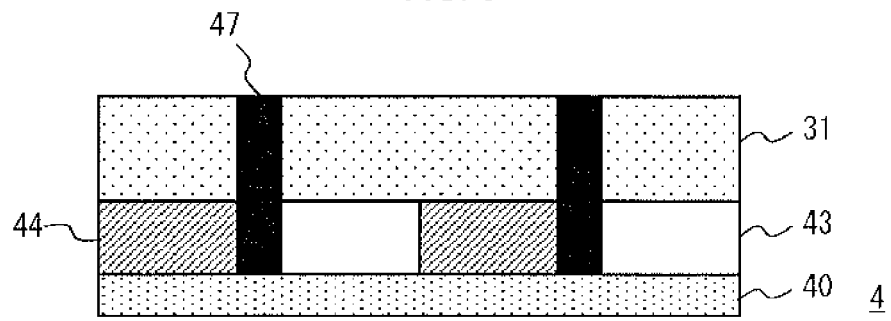
FIG. 6 is a partially enlarged cross-sectional diagram of the temperature detection diode shown in FIG. 5.

Between the MOS1 and the MOS2, the temperature detection diode 4 is provided over the semiconductor substrate 5 via an insulating film 40. Here, a structure of the temperature detection diode 4 will be explained with reference to FIGS. 5 and 6. FIG. 5 is a diagram when the temperature detection diode 4 is viewed from a top surface, and FIG. 6 is a partially enlarged cross-sectional diagram of FIG. 5.

As shown in FIG. 5, the temperature detection diode 4 has a configuration in which a connection structure including P-type polysilicon 43 and N-type polysilicon 44 and constituting a plurality of PN junctions has been concentrically arranged. As shown in FIG. 6, a contact metal 47 is provided between adjacent connection structures, respectively. The formation of the contact metal 47 in an NP junction portion between the PN junctions eliminates the NP junctions, and thus a bidirectional diode is converted into a multistage diode row.

A plurality of anode contacts 45 is provided on the P-type polysilicon 43 provided in a center. As shown in FIG. 3, the anode wiring 41 and the anode terminal T1 are provided at an upper layer of the anode contact 45. The anode terminal T1 and the P-type polysilicon 43 are coupled to each other via the anode contact 45 and the anode wiring 41.

A plurality of cathode contacts 46 is provided on the N-type polysilicon 44 provided at an outermost periphery. As shown in FIGS. 3 and 4, the cathode wiring 42 is provided on an upper layer of the cathode contact 46, and the cathode terminal T2 is provided on an upper layer of the cathode wiring 42. The cathode terminal T2 and the N-type polysilicon 44 are coupled to each other via the cathode contact 46 and the cathode wiring 42. That is, the temperature detection diode 4 is concentrically configured, with the anode terminal T1 that is the first terminal being as a center.

Referring to FIG. 3, the interlayer insulating film 31 is provided, over the semiconductor substrate 5 and the temperature detection diode 4, so as to cover them. Over the interlayer insulating film 31, there is provided a wiring layer including the above-mentioned source aluminum wiring 11, the gate aluminum wiring 12, the source aluminum wiring 21, the gate aluminum wiring 22, the separation wiring 30, the anode wiring 41, and the cathode wiring 42. The source aluminum wiring 11, the gate aluminum wiring 12, the source aluminum wiring 21, the gate aluminum wiring 22, and the separation wiring 30 are coupled to the base region 6, the gate trench 7, and the like in a lower layer, respectively, via the contact 32 provided in the interlayer insulating film 31.

Figure 7:
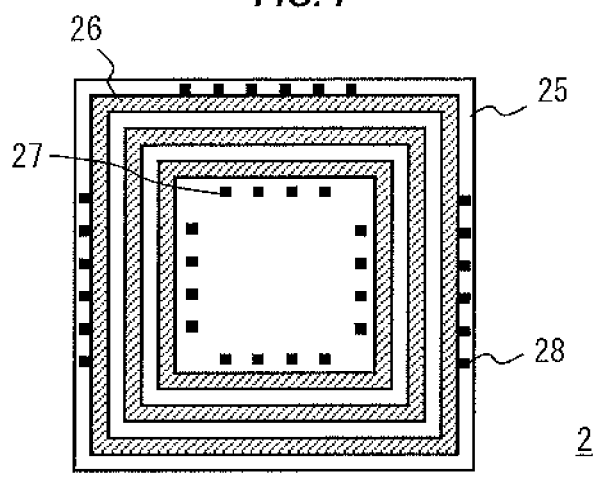
FIG. 7 is a diagram showing a configuration of a bidirectional Zener diode used for the semiconductor device shown in FIG. 2.

Referring to FIG. 4, the bidirectional Zener diodes 2 and 3 are formed at lower portions of the gate terminals G1 and G2, respectively. Here, configurations of the bidirectional Zener diodes 2 and 3 will be explained with reference to FIG. 7. FIG. 7 is a diagram showing the configurations of the bidirectional Zener diodes 2 and 3. Note that since the configurations of the bidirectional Zener diodes 2 and 3 are the same as each other, only the configuration of the bidirectional Zener diode 2 will be explained here.

The bidirectional Zener diode 2 is formed over the semiconductor substrate 5 via the insulating film 40. Referring to FIG. 7, the bidirectional Zener diode 2 has the configuration in which a P-type polysilicon 25 and an N-type polysilicon 26 have been alternately and concentrically formed. A plurality of contacts 27 is provided at the P-type polysilicon 25 provided in a center. The P-type polysilicon 25 provided in the center is coupled to the gate aluminum wiring 12 via the contacts 27. A plurality of contacts 28 is provided on the P-type polysilicon 25 provided at an outermost periphery. The P-type polysilicon 25 provided at the outermost periphery is coupled to the source aluminum wiring 11 via the contacts 28.

The protective insulating film 33 is provided over the wiring layer so as to cover it. The source terminal S1 is formed over the source aluminum wiring 11, and the source terminal S2 is formed over the source aluminum wiring 21. In addition, the anode terminal T1 is formed over the anode wiring 41, and the cathode terminal T2 is formed over the cathode wiring 42. The gate terminal G1 is formed over the leader line 13, and the gate terminal G2 is formed over the leader line 23. The source terminals S1 and S2, the gate terminals G1 and G2, the anode terminal T1, and the cathode terminal T2 are exposed from the protective insulating film 33.

A drain electrode 8 is provided on a back surface side of the semiconductor substrate 5. In the semiconductor device having the present configuration, when a current flows from the source terminal S1 toward the source terminal S2, a current path is formed in a direction of the source terminal S2 via the drain electrode 8 of the back surface from the source terminal S1 as shown by an arrow of FIG. 3. Note that the vertical transistor structure may have any configuration, as long as it is the structure of flowing a current in a direction via the source aluminum wiring 11 of the surface of the chip, the drain electrode 8 of the back surface, and the source aluminum wiring 21 of the surface of the chip so that the current flows vertically in the semiconductor substrate 5. In addition, the above-described configuration is one example, and the N-type and the P-type may be opposite to each other.

As mentioned above, the anode terminal T1 is arranged at the intersection of the straight line that passes through the source terminal S1 and the source terminal S2, and the boundary line of the MOS1 and the MOS2, and the temperature detection diode 4 is laid out, with the intersection being as the center. A current that flows through the MOSFET flows to the source terminal S2 through the MOS1, the drain electrode 8 and the MOS2 from the source terminal S1. At this time, a large amount of current flows over the straight line, which is the shortest path, connecting the source terminal S1 and the source terminal S2. When an abnormal current flows, the current reaches a peak over the shortest path, and an amount of heat generation becomes the largest.

As in the First Embodiment, the temperature detection diode 4 is arranged at a position where a current between the source terminal S1 and the source terminal S2 reaches the peak, and thus it becomes possible to more accurately detect a rise in temperature when the abnormal current flows. In addition, a wiring can be made the shortest by arranging the temperature detection diode 4 under the anode terminal T1, and it becomes possible to extend a region where an MOSFET element is arranged, i.e., a source aluminum wiring region. Since the source aluminum wiring region becomes substantially equal to an active region, the larger the region is, the lower on-resistance the MOSFET has. Because of this, it becomes possible to increase an effective cell area without increasing a size.

Here, referring to FIGS. 8A to 8G, a method of manufacturing the semiconductor device according to the First Embodiment will be explained. FIGS. 8A to 8G are manufacturing process cross-sectional views explaining the method of manufacturing the semiconductor device according to the First Embodiment. FIGS. 8A to 8G show manufacturing processes of the temperature detection diode 4 used for the semiconductor device 1.

Figure 8A:
FIG. 8A is a manufacturing process cross-sectional diagram explaining a method of manufacturing the semiconductor device according to the First Embodiment.
Figure 8B:
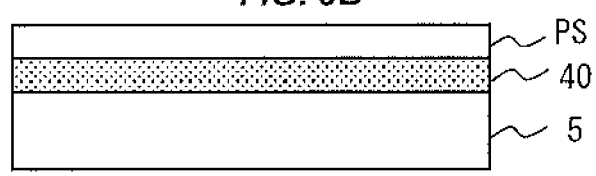
FIG. 8B is a manufacturing process cross-sectional diagram explaining the method of manufacturing the semiconductor device according to the First Embodiment.
Figure 8C:
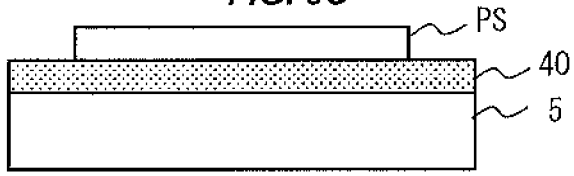
FIG. 8C is a manufacturing process cross-sectional diagram explaining the method of manufacturing the semiconductor device according to the First Embodiment.

First, as shown in FIG. 8A, after the insulating film 40 such as an oxide film is formed over the semiconductor substrate 5, polysilicon S is deposited. After that, boron is injected and P-type polysilicon PS is formed (FIG. 8B). After a photoresist (not shown) is formed over the P-type polysilicon PS, the P-type polysilicon PS is etched in a predetermined shape by a known method (FIG. 8C).

Figure 8D:
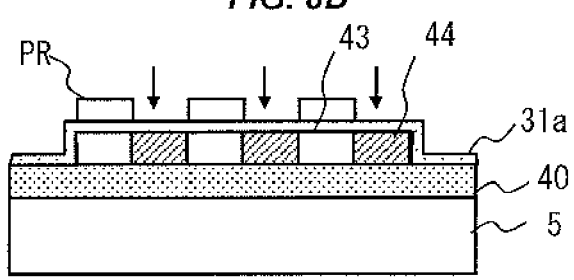
FIG. 8D is a manufacturing process cross-sectional diagram explaining the method of manufacturing the semiconductor device according to the First Embodiment.
Figure 8E:
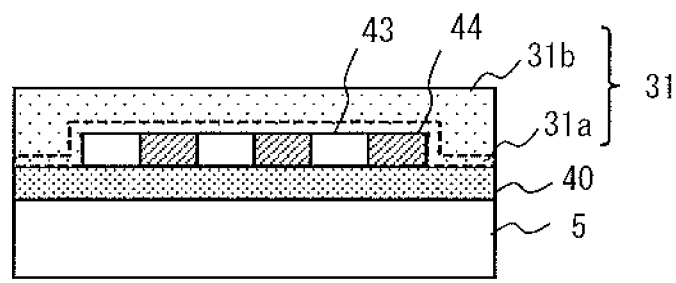
FIG. 8E is a manufacturing process cross-sectional diagram explaining the method of manufacturing the semiconductor device according to the First Embodiment.

After that, an interlayer insulating film 31a is formed over the P-type polysilicon PS, and a photoresist PR is formed thereover. By using the photoresist PR as a mask, injection of arsenic into a part of the P-type polysilicon PS makes the P-type polysilicon an N-type one. Because of this, a structure is formed in which the P-type polysilicon 43 and the N-type polysilicon 44 are alternately aligned (FIG. 8D). Then, after peeling of the photoresist PR, an interlayer insulating film 31b is formed. The interlayer insulating films 31a and 31b serve as the interlayer insulating film 31 (FIG. 8E).

Figure 8F:
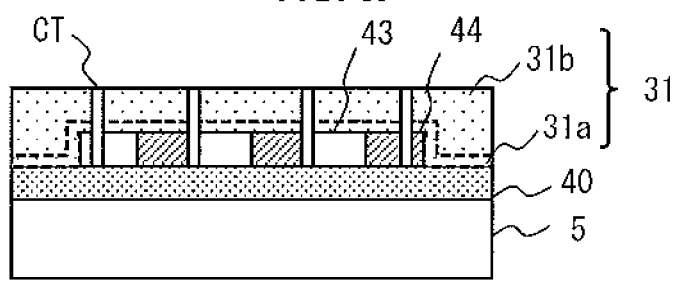
FIG. 8F is a manufacturing process cross-sectional diagram explaining the method of manufacturing the semiconductor device according to the First Embodiment.
Figure 8G:
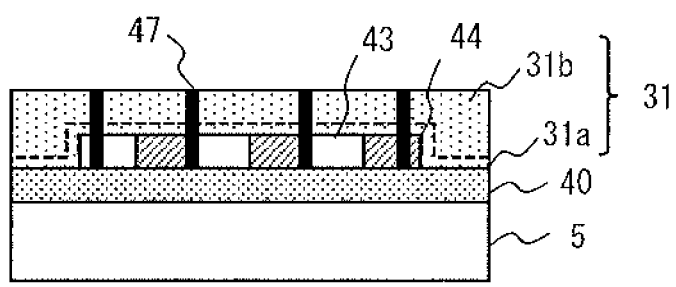
FIG. 8G is a manufacturing process cross-sectional diagram explaining the method of manufacturing the semiconductor device according to the First Embodiment.

After the interlayer insulating film 31b is formed, etching is performed using a photoresist that is not shown, and contact holes CT are formed in a boundary of the P-type polysilicon 43 and the N-type polysilicon 44 so that the PN junction is cut (FIG. 8F). At this time, further contact holes CT are also simultaneously formed in positions serving as the anode contact 45 and the cathode contact 46. Then, after sputtering of a barrier metal is performed, the contact metal 47, the anode contact 45, and the cathode contact 46 are formed in the contact holes CT (FIG. 8G). Note that the same applies to the manufacturing processes of the bidirectional Zener diodes 2 and 3 shown in FIG. 7 although, in the above-mentioned processes, the formation is made in only different positions.

As described above, the temperature detection diode 4 can be formed in the same processes as the manufacturing processes of the bidirectional Zener diodes 2 and 3. Generally, since the bidirectional Zener diodes 2 and 3 are mounted for protecting ESD (electro-static discharge), an additional process is not needed, and it becomes possible to mount the temperature detection diode 4 without increasing manufacturing cost. In addition, in the temperature detection diode 4 of the present configuration, a plurality of diodes is continuously formed by shorting the NP junction portions by the contact metal 47 so that the PN junction portions are maintained. Because of this, since the temperature detection diode 4 of multistage connection can be achieved by the shortest distance, it becomes possible to form the temperature detection diode 4 having a small area.

Figure 9:
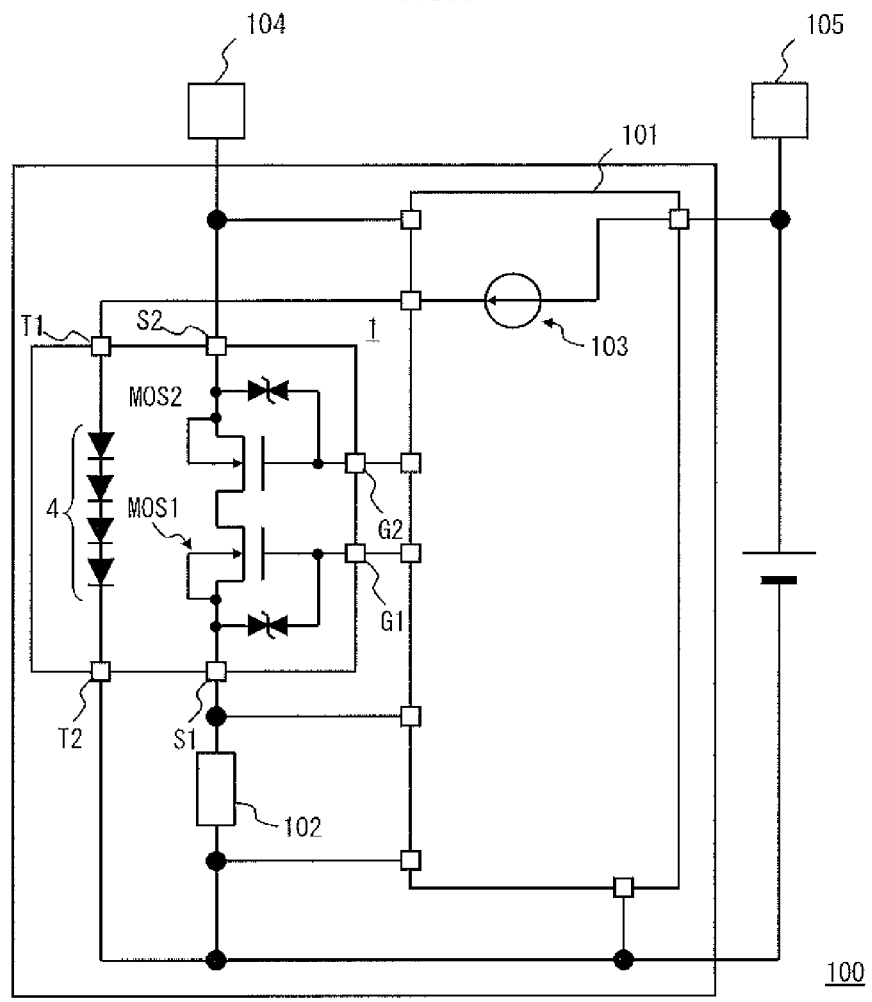
FIG. 9 is a circuit diagram showing a configuration of a battery protection circuit using the semiconductor device according to the First Embodiment.

In FIG. 9, there is shown a circuit diagram of a battery protection circuit 100 using the semiconductor device of the First Embodiment. The battery protection circuit 100 is provided with the semiconductor device 1, a control IC 101, and a current detection resistor 102. A constant current is caused to flow from a constant current source 103 in the control IC 101, to the temperature detection diode 4 in the semiconductor device 1, and a voltage VF between an anode and a cathode of the temperature detection diode 4 is monitored. When the semiconductor device 1 generates heat, the VF changes due to a negative temperature coefficient of the temperature detection diode 4. The control IC 101 determines that abnormal heat generation occurs when the VF reaches a predetermined voltage, the control IC 101 switches OFF the MOS1 and the MOS2, and interrupts a current.

Figure 10:
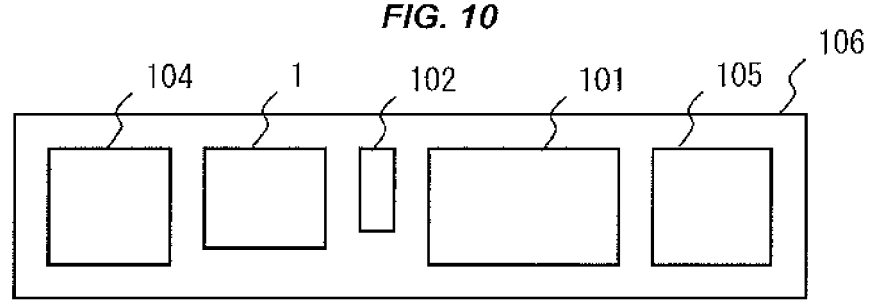
FIG. 10 is a diagram showing a state where the battery protection circuit using the semiconductor device according to the First Embodiment is mounted on a substrate.
Figure 11:
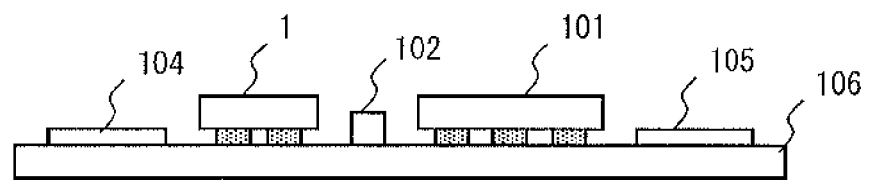
FIG. 11 is a diagram showing the state where the battery protection circuit using the semiconductor device according to the First Embodiment is mounted on the substrate.

In FIGS. 10 and 11 is shown an example in which the battery protection circuit 100 shown in FIG. 9 has been mounted on a substrate. FIG. 11 is a diagram when the battery protection circuit 100 shown in FIG. 10 is viewed from a side. The semiconductor device 1, pads 104 and 105, the control IC 101, and the current detection resistor 102 are mounted at a substrate 106 as shown in FIG. 10. The temperature detection diode 4 is incorporated in the semiconductor device 1, and it is not mounted over the substrate 106. As described above, the temperature detection diode 4 is incorporated in the semiconductor device 1, and thus the number of parts can be reduced and a mounting area thereof can be reduced.

In addition, the drain electrode 8 is formed on the back surface side of the semiconductor device 1, and thus when the semiconductor device 1 is mounted on the substrate 106, the drain electrode 8 is exposed to a top surface. Therefore, when the temperature detection diode 4 is arranged over the semiconductor device 1, an insulating sheet needs to be arranged in order to insulate the drain electrode 8. However, in the First Embodiment, since the temperature detection diode 4 is incorporated in the semiconductor device 1, the insulating sheet is not needed, and a mounting height can be reduced as shown in FIG. 11. Therefore, cost reduction and thickness reduction are possible.

Second Embodiment

Figure 12:
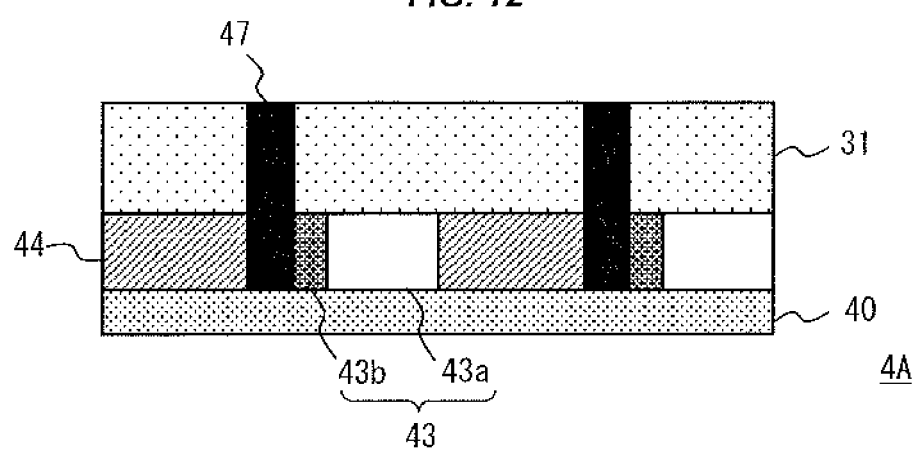
FIG. 12 is a partially enlarged cross-sectional diagram of a temperature detection diode used for a semiconductor device according to a Second Embodiment.

A semiconductor device according to a Second Embodiment will be explained with reference to FIG. 12. FIG. 12 is a partially enlarged cross-sectional diagram of a configuration of a temperature detection diode 4A used for the semiconductor device according to the Second Embodiment. As shown in FIG. 12, the P-type polysilicon 43 has a first impurity concentration region 43a provided on an N-type polysilicon 44 side, and a second impurity concentration region 43b provided on a contact metal 47 side. The second impurity concentration region 43b has a higher impurity concentration than the first impurity concentration region 43a.

The impurity concentration of the second impurity concentration region 43b that is in contact with the contact 47 is made higher than the first impurity concentration region 43a as described above, and thus sufficient connectivity with the contact 47 can be obtained. In addition, since multistage connection of diodes can be realized by the shortest distance in the same way as in the First Embodiment, it becomes possible to form the temperature detection diode 4A having a small area.

Figure 13A:
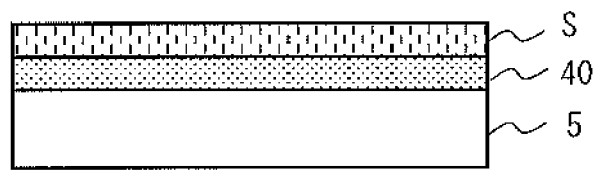
FIG. 13A is a manufacturing process cross-sectional diagram of the semiconductor device according to the Second Embodiment.
Figure 13B:
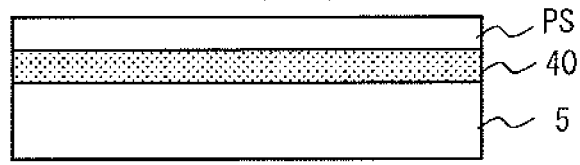
FIG. 13B is a manufacturing process cross-sectional diagram of the semiconductor device according to the Second Embodiment.
Figure 13C:
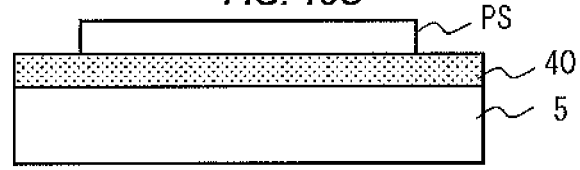
FIG. 13C is a manufacturing process cross-sectional diagram of the semiconductor device according to the Second Embodiment.
Figure 13D:
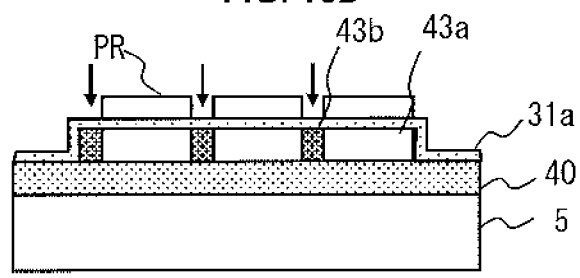
FIG. 13D is a manufacturing process cross-sectional diagram of the semiconductor device according to the Second Embodiment.

In FIGS. 13A to 13I, there are shown manufacturing process cross-sectional views explaining a method of manufacturing the semiconductor device according to the Second Embodiment. Since FIGS. 13A to 13C are the same as FIGS. 8A to 8C, explanation thereof is omitted. As shown in FIG. 13D, the interlayer insulating film 31a is formed over the P-type polysilicon PS, and over the interlayer insulating film 31a, the photoresist PR having opening portions is formed in a region serving as the second impurity concentration region 43b. Boron is injected by using this photoresist PR as a mask, and the second impurity concentration region 43b is formed.

Figure 13E:
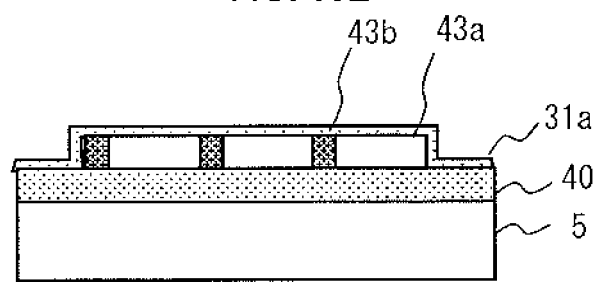
FIG. 13E is a manufacturing process cross-sectional diagram of the semiconductor device according to the Second Embodiment.
Figure 13F:
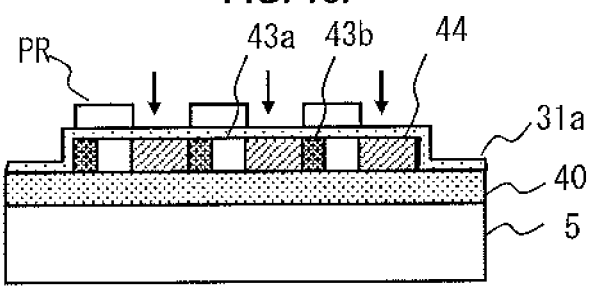
FIG. 13F is a manufacturing process cross-sectional diagram of the semiconductor device according to the Second Embodiment.
Figure 13G:
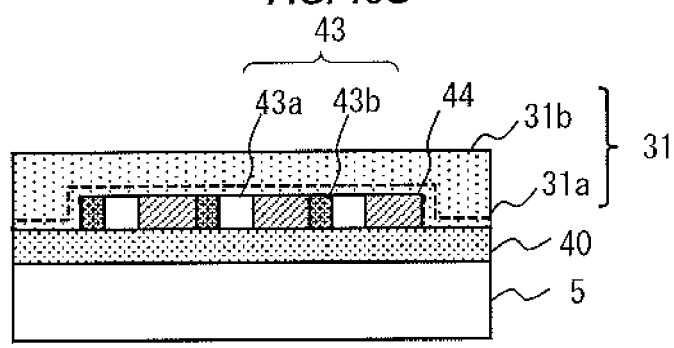
FIG. 13G is a manufacturing process cross-sectional diagram of the semiconductor device according to the Second Embodiment.

After that, the photoresist PR is peeled (FIG. 13E). Then, as shown in FIG. 13F, another photoresist PR having opening portions is formed in a region serving as the N-type polysilicon 44 over the interlayer insulating film 31a, and injection of arsenic into a part of the P-type polysilicon PS makes the polysilicon an N-type one. Because of this, a structure, in which the second impurity concentration region 43b, the first impurity concentration region 43a, and the N-type polysilicon 44 are aligned in order, is formed (FIG. 13F). Then, after peeling of the photoresist PR, the interlayer insulating film 31b is formed. The interlayer insulating films 31a and 31b serve as the interlayer insulating film 31 (FIG. 13G).

Figure 13H:
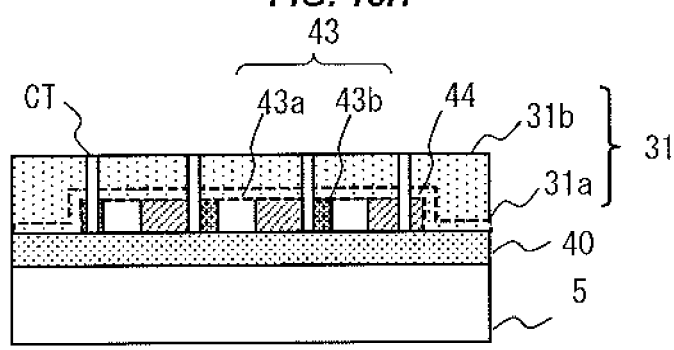
FIG. 13H is a manufacturing process cross-sectional diagram of the semiconductor device according to the Second Embodiment.
Figure 13I:
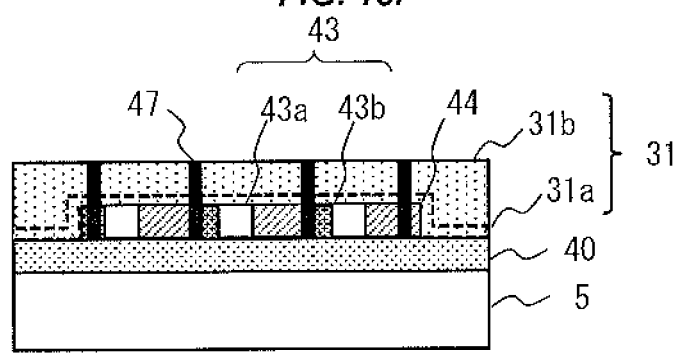
FIG. 13I is a manufacturing process cross-sectional diagram of the semiconductor device according to the Second Embodiment.

After the interlayer insulating film 31b is formed, etching is performed using a photoresist that is not shown, and the contact holes CT are formed at a boundary of the second impurity concentration region 43b and the N-type polysilicon 44 (FIG. 13H). At this time, further contact holes CT are also simultaneously formed in positions serving in the leftmost second impurity concentration region 43b and the rightmost N-type polysilicon 44. Note that the same applies to the manufacturing processes of the bidirectional Zener diodes 2 and 3 shown in FIG. 7 although, in the above-mentioned processes, the formation is made in only different positions. Then, after sputtering of the barrier metal, the contact metal 47 is formed in the contact holes CT (FIG. 13I). In addition, along with this, the anode contact 45 and the cathode contact 46 are also formed.

As described above, the temperature detection diode 4A can be formed in the same processes as the manufacturing processes of the bidirectional Zener diodes 2 and 3. Because of this, it becomes possible to mount the temperature detection diode 4A on the semiconductor device 1 without increasing the manufacturing processes.

Third Embodiment

Figure 14:
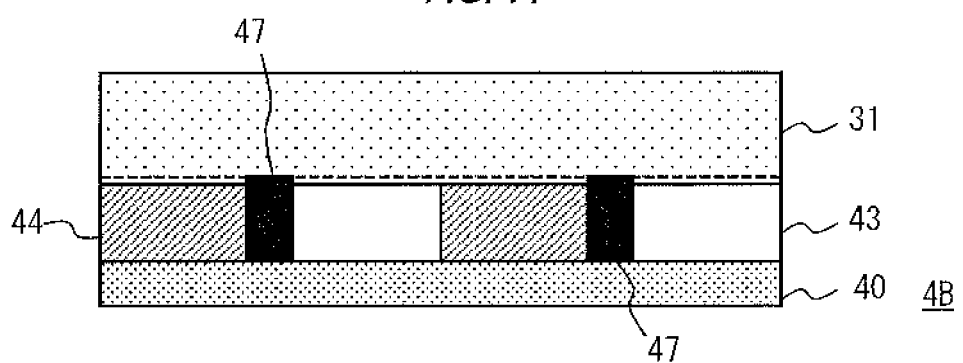
FIG. 14 is a partially enlarged cross-sectional diagram of a temperature detection diode used for a semiconductor device according to a Third Embodiment.

A semiconductor device according to a Third Embodiment will be explained with reference to FIG. 14. FIG. 14 is a partially enlarged cross-sectional diagram of a configuration of a temperature detection diode 4B used for the semiconductor device according to the Third Embodiment. As shown in FIG. 14, the P-type polysilicon 43 and the N-type polysilicon 44 are alternately formed in a lateral direction over the insulating film 40. The P-type polysilicon 43 and the N-type polysilicon 44 are covered with the interlayer insulating film 31.

The contact metal 47 is formed between connection structures of the P-type polysilicon 43 and the N-type polysilicon 44. In the Third Embodiment, unlike the First and Second Embodiments, the contact metal 47 has substantially the same height as the P-type polysilicon 43 and the N-type polysilicon 44, and has a structure covered with the interlayer insulating film 31.

As described above, the interlayer insulating film 31 is arranged between the contact metal 47 and a layer that forms a wiring layer including the source aluminum wiring 11, the source aluminum wiring 21, and the like. Because of this, it becomes possible to form the wiring layer directly over the temperature detection diode 4B, and to achieve a more efficient layout.

In FIGS. 15A to 15I, there are shown manufacturing process cross-sectional views explaining a method of manufacturing the semiconductor device according to the Third Embodiment. Since FIGS. 15A to 15D are the same as FIGS. 8A to 8D, explanation thereof is omitted. After the N-type polysilicon 44 is formed, the photoresist PR is peeled, and a photoresist (not shown) for forming the contact metal 47 is formed. Etching is performed by using this photoresist as a mask, and the contact holes CT are formed between the connection structures of the P-type polysilicon 43 and the N-type polysilicon 44.

Figure 15A:
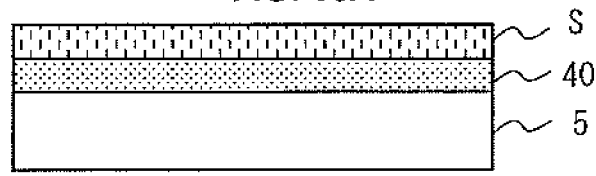
FIG. 15A is a manufacturing process cross-sectional diagram of the semiconductor device according to the Third Embodiment.
Figure 15B:
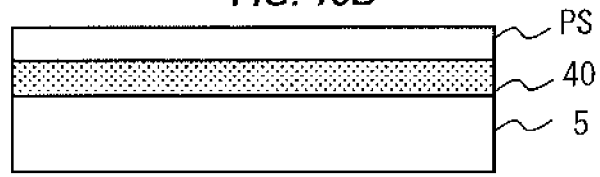
FIG. 15B is a manufacturing process cross-sectional diagram of the semiconductor device according to the Third Embodiment.
Figure 15C:
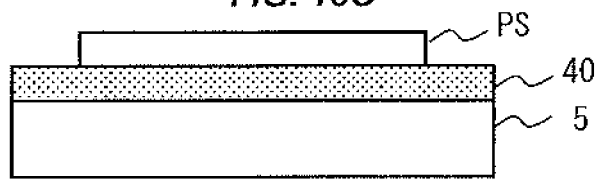
FIG. 15C is a manufacturing process cross-sectional diagram of the semiconductor device according to the Third Embodiment.
Figure 15D:
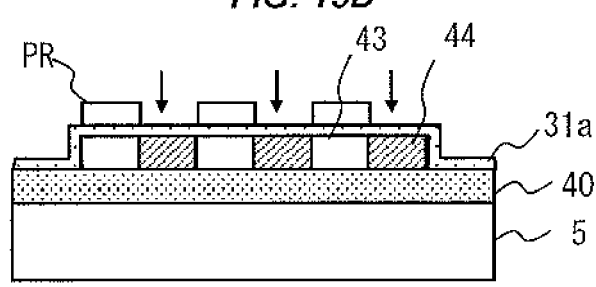
FIG. 15D is a manufacturing process cross-sectional diagram of the semiconductor device according to the Third Embodiment.
Figure 15E:
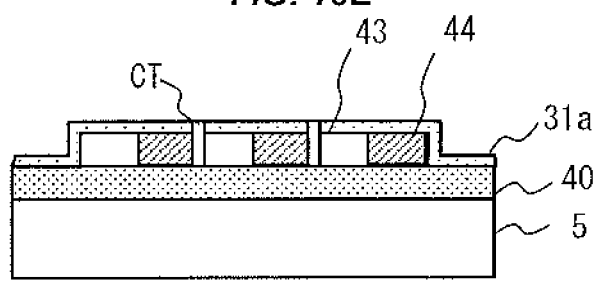
FIG. 15E is a manufacturing process cross-sectional diagram of the semiconductor device according to the Third Embodiment.
Figure 15F:
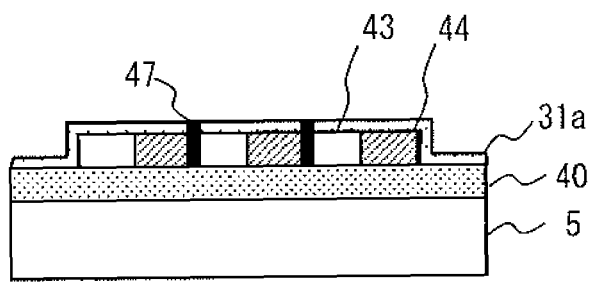
FIG. 15F is a manufacturing process cross-sectional diagram of the semiconductor device according to the Third Embodiment.
Figure 15G:
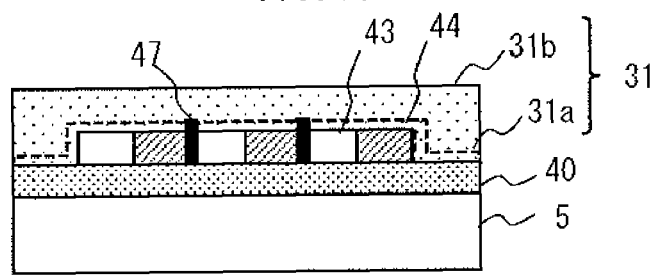
FIG. 15G is a manufacturing process cross-sectional diagram of the semiconductor device according to the Third Embodiment.
Figure 15H:
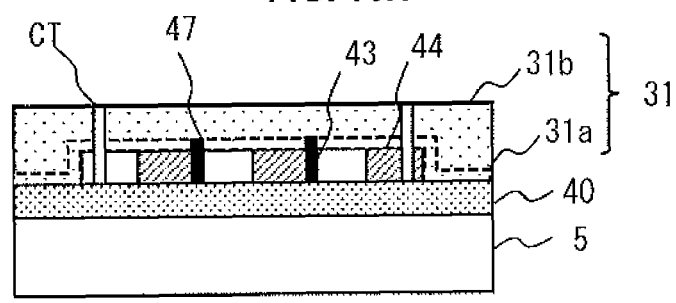
FIG. 15H is a manufacturing process cross-sectional diagram of the semiconductor device according to the Third Embodiment.
Figure 15I:
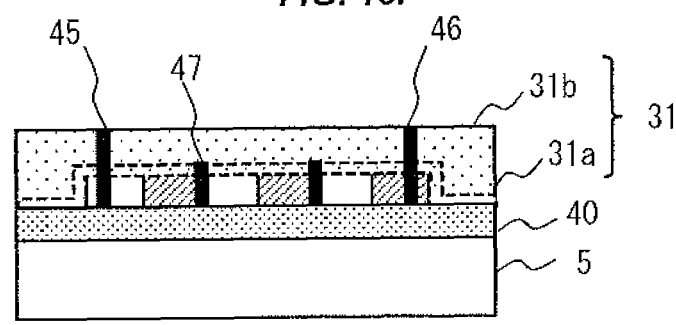
FIG. 15I is a manufacturing process cross-sectional diagram of the semiconductor device according to the Third Embodiment.

After that, after sputtering of the barrier metal, the contact metal 47 is formed in the contact holes CT (FIG. 15F). Then, the interlayer insulating film 31b is formed so as to cover the contact metal 47. The interlayer insulating films 31a and 31b serve as the interlayer insulating film 31 (FIG. 15G). After the interlayer insulating film 31b is formed, etching is performed using a photoresist that is not shown, and further contact holes CT are formed in positions serving as the anode contact 45 and the cathode contact 46 (FIG. 15H). Then, after sputtering of the barrier metal, the anode contact 45 and the cathode contact 46 are formed in the contact holes CT (FIG. 15I).

Fourth Embodiment

Figure 16:
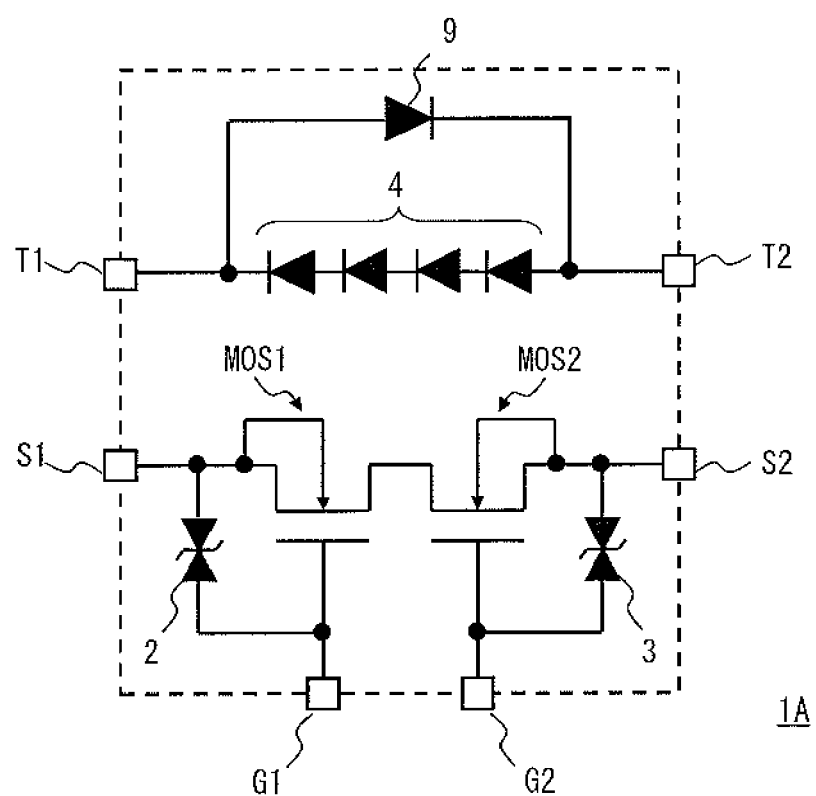
FIG. 16 is a circuit diagram showing a configuration of a semiconductor device according to a Fourth Embodiment.

A semiconductor device according to a Fourth Embodiment will be explained with reference to FIG. 16. FIG. 16 is a circuit diagram showing a configuration of a semiconductor device 1A according to the Fourth Embodiment. In the Fourth Embodiment, a different point from the First Embodiment is the point where a protection diode 9 is provided. In the Fourth Embodiment, the same symbol is attached to the component as in the First Embodiment, and explanation thereof is omitted.

Figure 17:
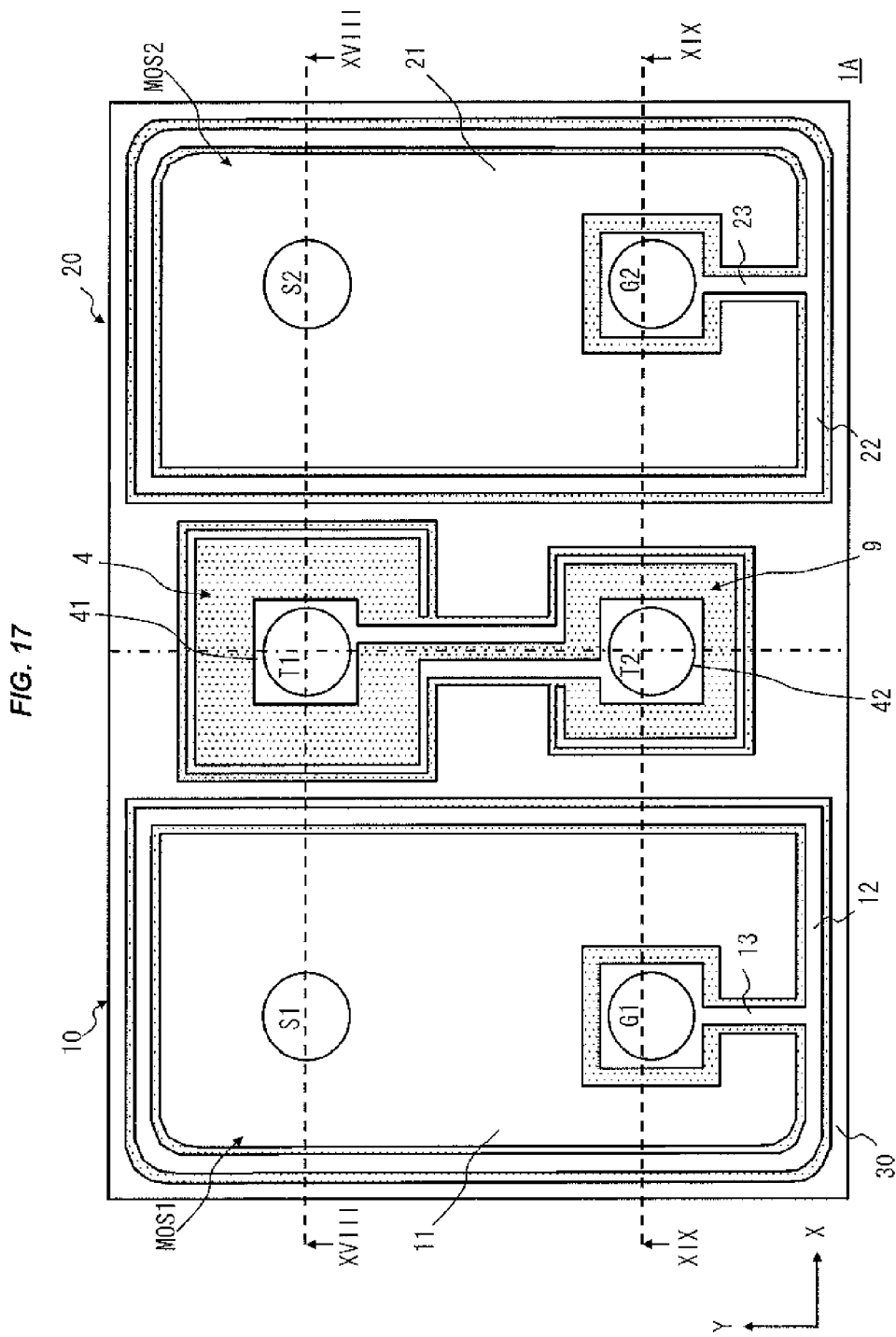
FIG. 17 is a diagram showing a surface layout of the semiconductor device shown in FIG. 16.

As shown in FIG. 16, the protection diode 9 is coupled in parallel with the temperature detection diode 4 and in an opposite direction to the temperature detection diode 4. A surface layout of the semiconductor device 1A according to the Fourth Embodiment is shown in FIG. 17. In FIG. 17, a boundary line of the first region 10 and the second region 20 is shown by a dashed line. As shown in FIG. 17, the anode terminal T1 is arranged at an intersection of a straight line connecting the source terminal S1 and the source terminal S2, and a boundary line of the MOS1 and the MOS2. The temperature detection diode 4 is arranged under the anode terminal T1, with the anode terminal T1 being as a center.

Figure 18:
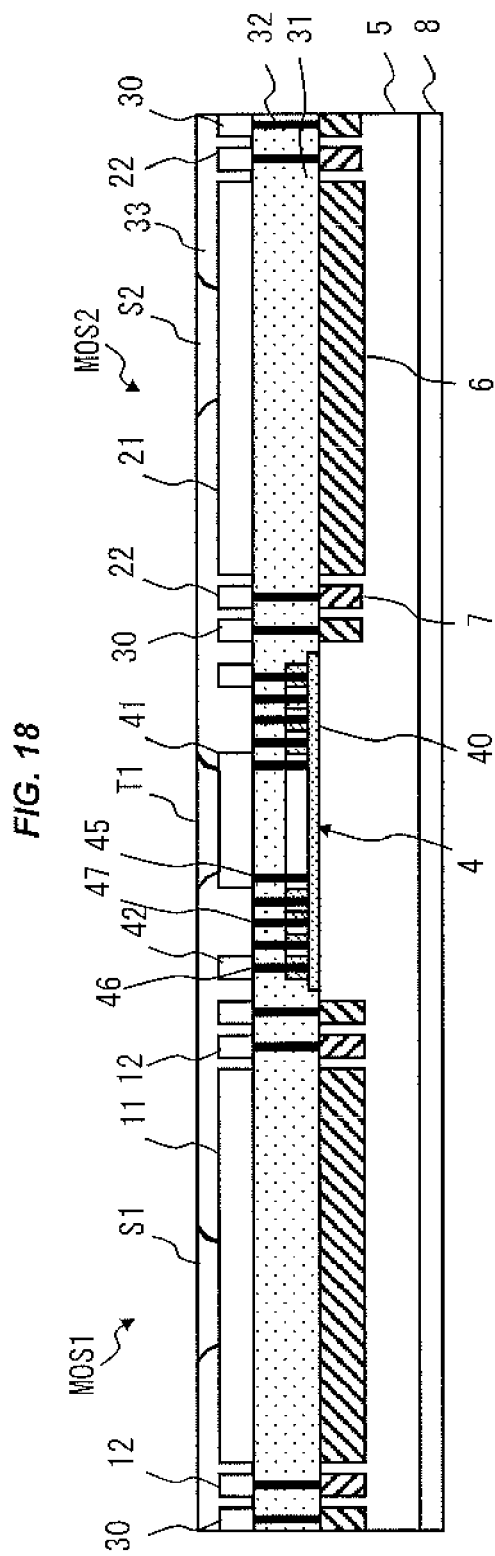
FIG. 18 is a cross-sectional diagram of the semiconductor device taken along a line XVIII-XVIII shown in FIG. 17.

In addition, the cathode terminal T2 is arranged at an intersection of a straight line connecting the gate terminal G1 and the gate terminal G2, and the boundary line of the MOS1 and the MOS2. The protection diode 9 is arranged under the cathode terminal T2. FIG. 18 is a cross-sectional diagram of the semiconductor device 1A taken along a line XVIII-XVIII shown in FIG. 17. Since the cross-sectional diagram shown in FIG. 18 is the same as the cross-sectional diagram shown in FIG. 3, explanation thereof is omitted.

Figure 19:
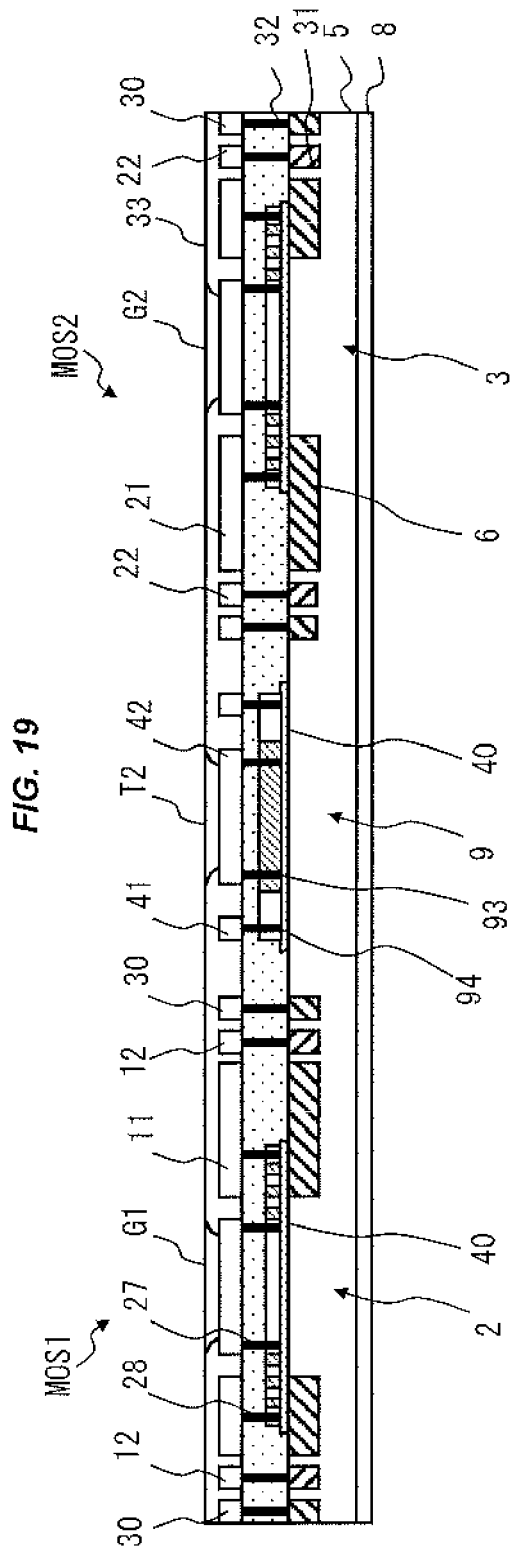
FIG. 19 is a cross-sectional diagram of the semiconductor device taken along a line XIX-XIX shown in FIG. 17.
Figure 20:
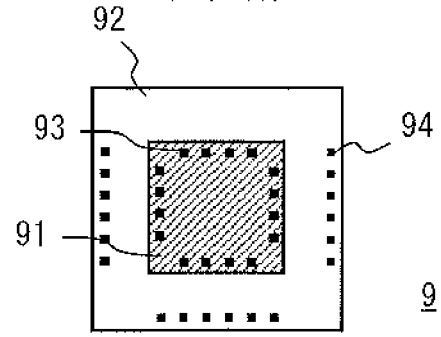
FIG. 20 is a diagram showing a configuration of a protection diode used for the semiconductor device shown in FIG. 17.

FIG. 19 is a cross-sectional diagram of the semiconductor device 1A taken along a line XIX-XIX shown in FIG. 17. As shown in FIG. 19, the protection diode 9 is arranged under the cathode terminal T2. The protection diode 9 is formed over the semiconductor substrate 5 via the insulating film 40. A configuration of the protection diode 9 is shown in FIG. 20. FIG. 20 is a diagram when the protection diode 9 is viewed from a top surface. As shown in FIG. 20, the protection diode 9 has N-type polysilicon 91, P-type polysilicon 92, contacts 93, and contacts 94.

The P-type polysilicon 92 is provided so as to surround an outer periphery of the N-type polysilicon 91. The N-type polysilicon 91 and the P-type polysilicon 92 are concentrically arranged, with a formation position of the cathode terminal T2 being as a center. The contacts 93 are provided in the N-type polysilicon 91. The N-type polysilicon 91 is coupled to the cathode wiring 42 through the contacts 93.

As shown in FIG. 19, the P-type polysilicon 92 is coupled to the anode wiring 41 via the contacts 94. The protection diode 9 can be simultaneously formed by the same processes as the bidirectional Zener diodes 2 and 3 and the temperature detection diode 4. Note that the bidirectional Zener diodes 2 and 3 are provided under the gate terminals G1 and G2, respectively. This configuration is the same as the configuration explained in the First Embodiment.

As mentioned above, in the Fourth Embodiment, the protection diode 9 is provided in parallel with the temperature detection diode 4 in the opposite direction thereto. Therefore, even when a surge such as ESD is applied to the temperature detection diode 4 in the opposite direction, it becomes possible to absorb the serge by the protection diode 9, and breakdown of the temperature detection diode 4 can be prevented. In addition, in the Fourth Embodiment, the protection diode 9 is concentrically formed at the lower portion of the cathode terminal T2 of the temperature detection diode 4, with the formation position of the cathode terminal T2 being as the center. As described above, the protection diode 9 can be mounted without an accompanying increase in a chip size, by utilization of a region required for mounting the temperature detection diode 4. Because of this, it becomes possible to suppress cost increase.

Fifth Embodiment

Figure 21:
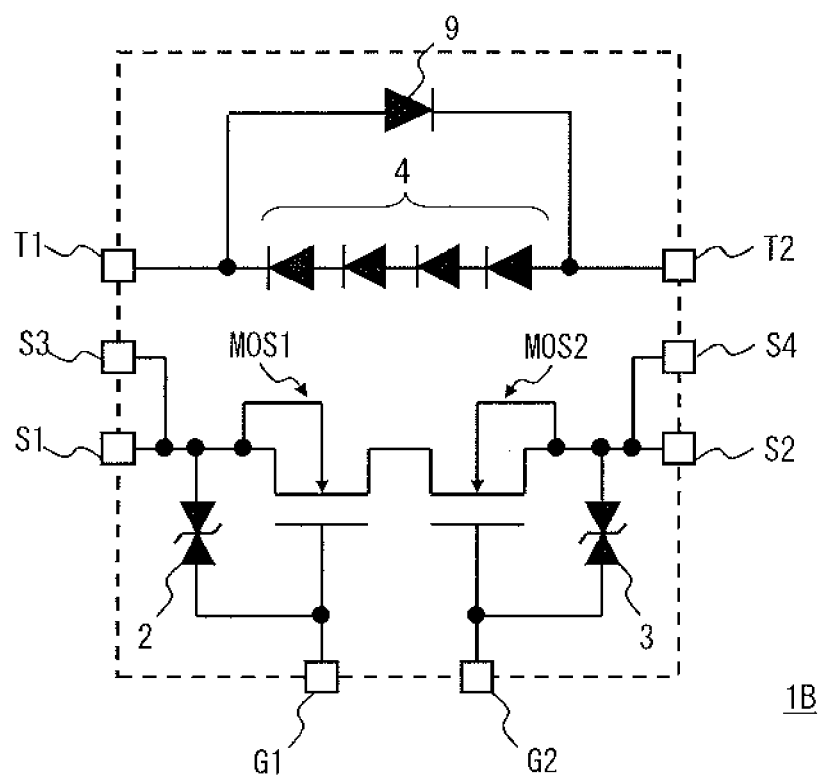
FIG. 21 is a circuit diagram showing a configuration of a semiconductor device according to a Fifth Embodiment.

A semiconductor device according to a Fifth Embodiment will be explained with reference to FIG. 21. FIG. 21 is a circuit diagram showing a configuration of a semiconductor device 1B according to the Fifth Embodiment. In the Fifth Embodiment, a different point from the Fourth Embodiment is the point where two source terminals are further added. In the Fifth Embodiment, the same symbol is attached to the same component as in the above-mentioned embodiments, and explanation thereof is omitted.

As shown in FIG. 21, a source of the MOS1 is coupled not only to the source terminal S1 but also to a source terminal S3. In addition, a source of the MOS2 is coupled not only to the source terminal S2 but also to a source terminal S4. In the Fifth Embodiment, in the same way as in the Fourth Embodiment, the protection diode 9 is coupled in parallel with the temperature detection diode 4 and in an opposite direction to the temperature detection diode 4. Note that the protection diode 9 may not be provided.

Figure 22:
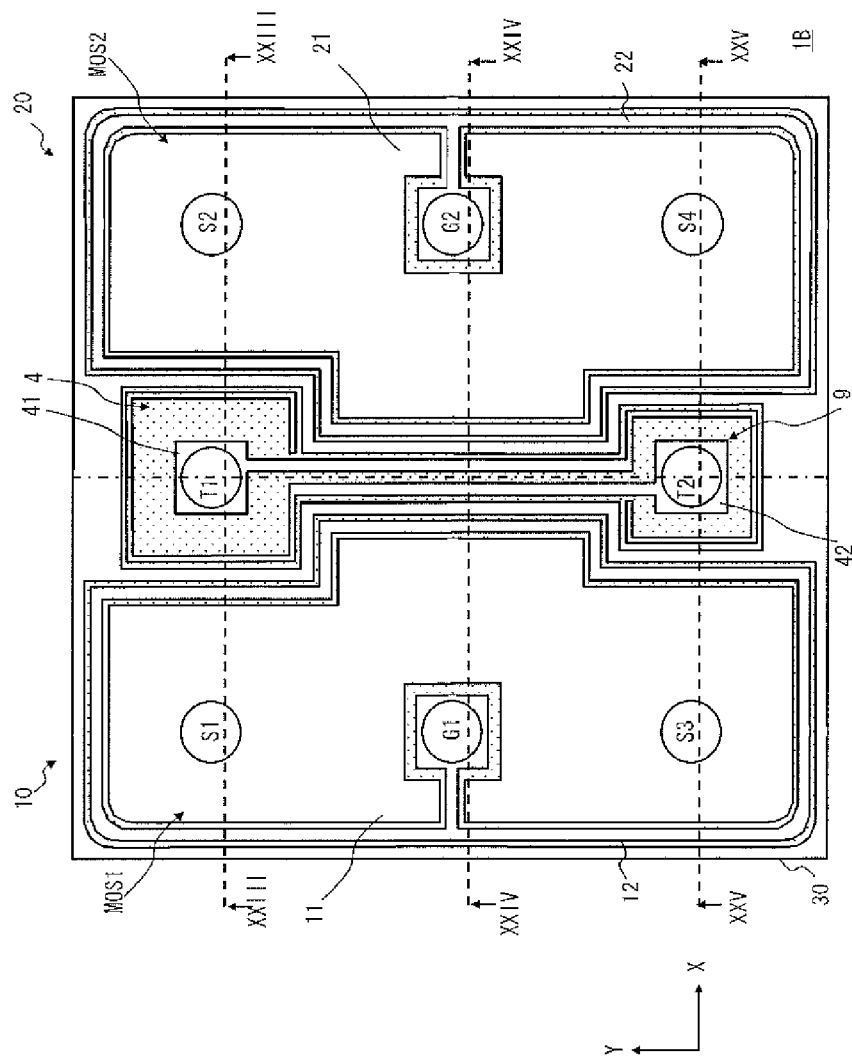
FIG. 22 is a diagram showing a surface layout of the semiconductor device shown in FIG. 21.

A surface layout of the semiconductor device 1B according to the Fourth Embodiment is shown in FIG. 22. As shown in FIG. 22, in the Fifth Embodiment, there are provided eight terminals of the source terminals S1, S2, S3, and S4, the gate terminals G1 and G2, the anode terminal T1, and the cathode terminal T2. In FIG. 22, a boundary line of the first region 10 and the second region 20 is shown by a dashed line. The source terminal S1 and the source terminal S2 are arranged facing each other while sandwiching the boundary line of the first region 10 and the second region 20. The source terminal S3 and the source terminal S4 are arranged facing each other while sandwiching the boundary line of the first region 10 and the second region 20. The gate terminal G1 and the gate terminal G2 are arranged facing each other while sandwiching the boundary line of the first region 10 and the second region 20.

In the first region 10, the gate terminal G1 is arranged between the source terminal 51 and the source terminal S3. A distance between the gate terminal G1 and the source terminal S1, and a distance between the gate terminal G1 and the source terminal S3 are substantially equal to each other. In the second region 20, the gate terminal G2 is arranged between the source terminal S2 and the source terminal S4. A distance between the gate terminal G2 and the source terminal S2, and a distance between the gate terminal G2 and the source terminal S4 are substantially equal to each other. Position deviation when melting of solder by heat causes connection can be suppressed by equalizing a pitch of the terminals.

The anode terminal T1 is arranged at an intersection of a straight line connecting the source terminal S1 and the source terminal S2, and a boundary line of the MOS1 and the MOS2. The temperature detection diode 4 is arranged under the anode terminal T1, with the anode terminal T1 being as a center. In addition, the cathode terminal T2 is arranged at an intersection of a straight line connecting the source terminal S3 and the source terminal S4, and the boundary line of the MOS1 and the MOS2. The protection diode 9 is arranged under the cathode terminal T2.

Figure 23:
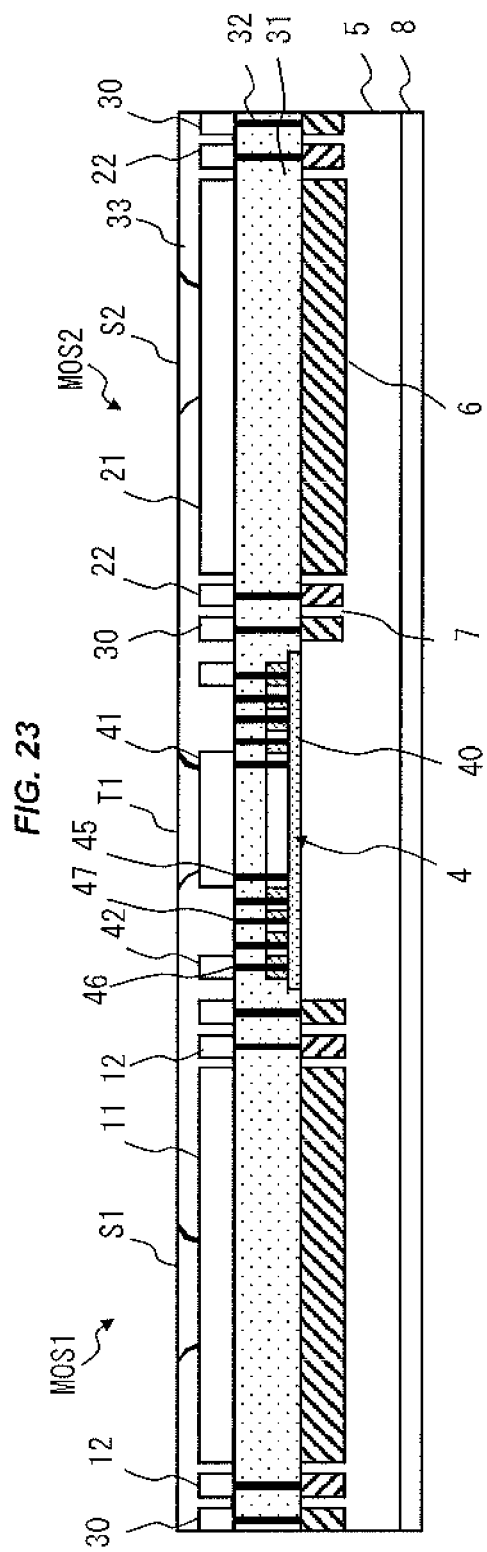
FIG. 23 is a cross-sectional diagram of the semiconductor device taken along a line XXIII-XXIII shown in FIG. 22.
Figure 24:
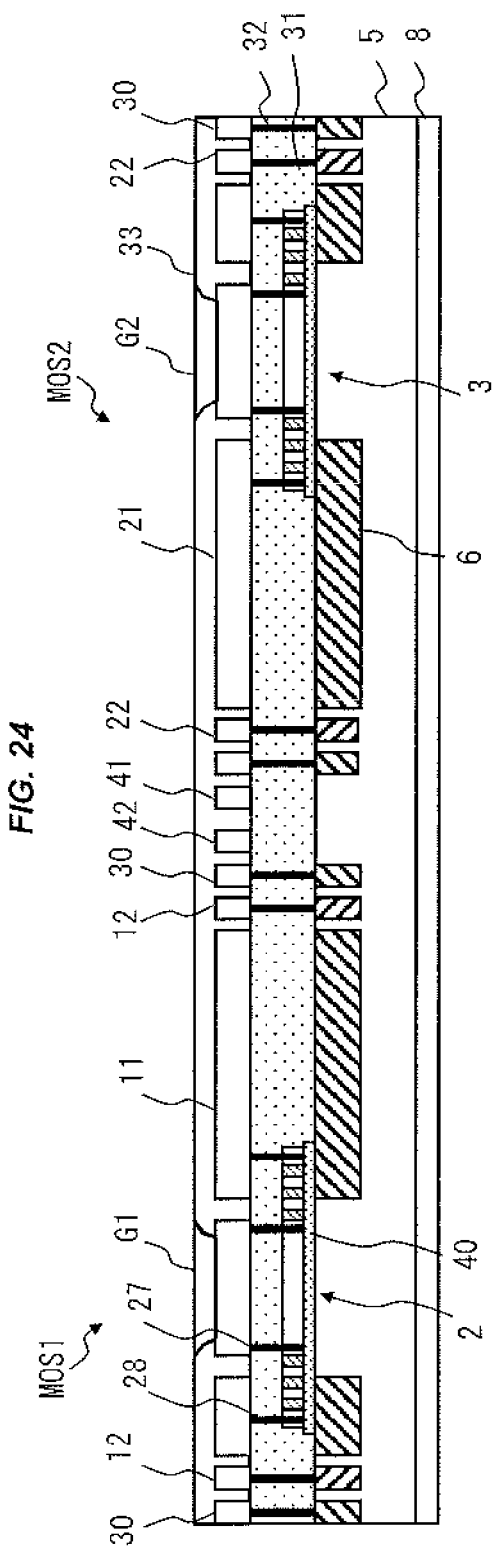
FIG. 24 is a cross-sectional diagram of the semiconductor device taken along a line XXIV-XXIV shown in FIG. 22.

FIG. 23 is a cross-sectional diagram of the semiconductor device 1B taken along a line XXIII-XXIII shown in FIG. 22. Since the cross-sectional diagram shown in FIG. 23 is the same as the cross-sectional diagram shown in FIG. 3, explanation thereof will be omitted. FIG. 24 is a cross-sectional diagram of the semiconductor device 13 taken along a line XXIV-XXIV shown in FIG. 22. In the Fifth Embodiment, no terminal is provided between the gate terminals G1 and G2. The bidirectional Zener diodes 2 and are provided under the gate terminals G1 and G2, respectively. This configuration is the same as the configuration explained in the First Embodiment.

Figure 25:
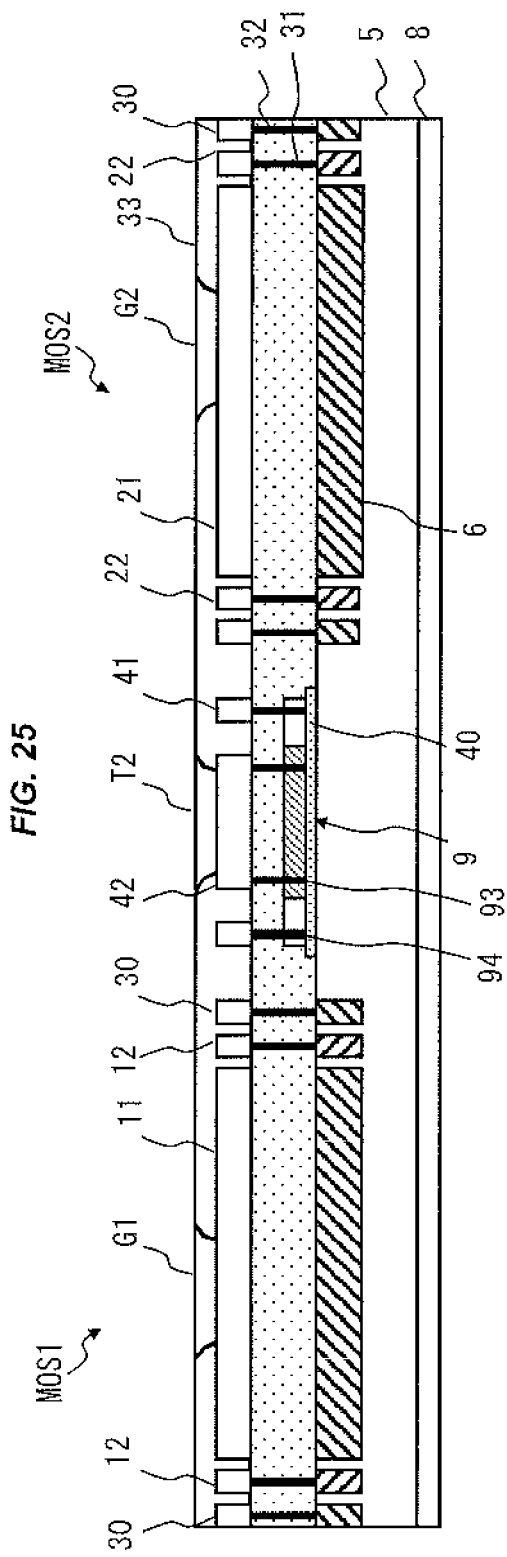
FIG. 25 is a cross-sectional diagram of the semiconductor device taken along a line XXV-XXV shown in FIG. 22.

FIG. 25 is a cross-sectional diagram of the semiconductor device 1B taken along a line XXV-XXV shown in FIG. 22. As shown in FIG. 25, the protection diode 9 is arranged under the cathode terminal T2. The protection diode 9 is formed over the semiconductor substrate 5 through the insulating film 40. The same configuration as the one shown in FIG. 20 can be used as the configuration of the protection diode 9.

In the Fifth Embodiment, a plurality of source terminals is provided at the MOS1 and the MOS2, respectively, and an effective cell area is increased. Because of this, it becomes possible to achieve low on-resistance. In addition, since the temperature detection diode 4 and the protection diode 9 are incorporated, an effect similar to the above can be obtained.

Sixth Embodiment

Figure 26:
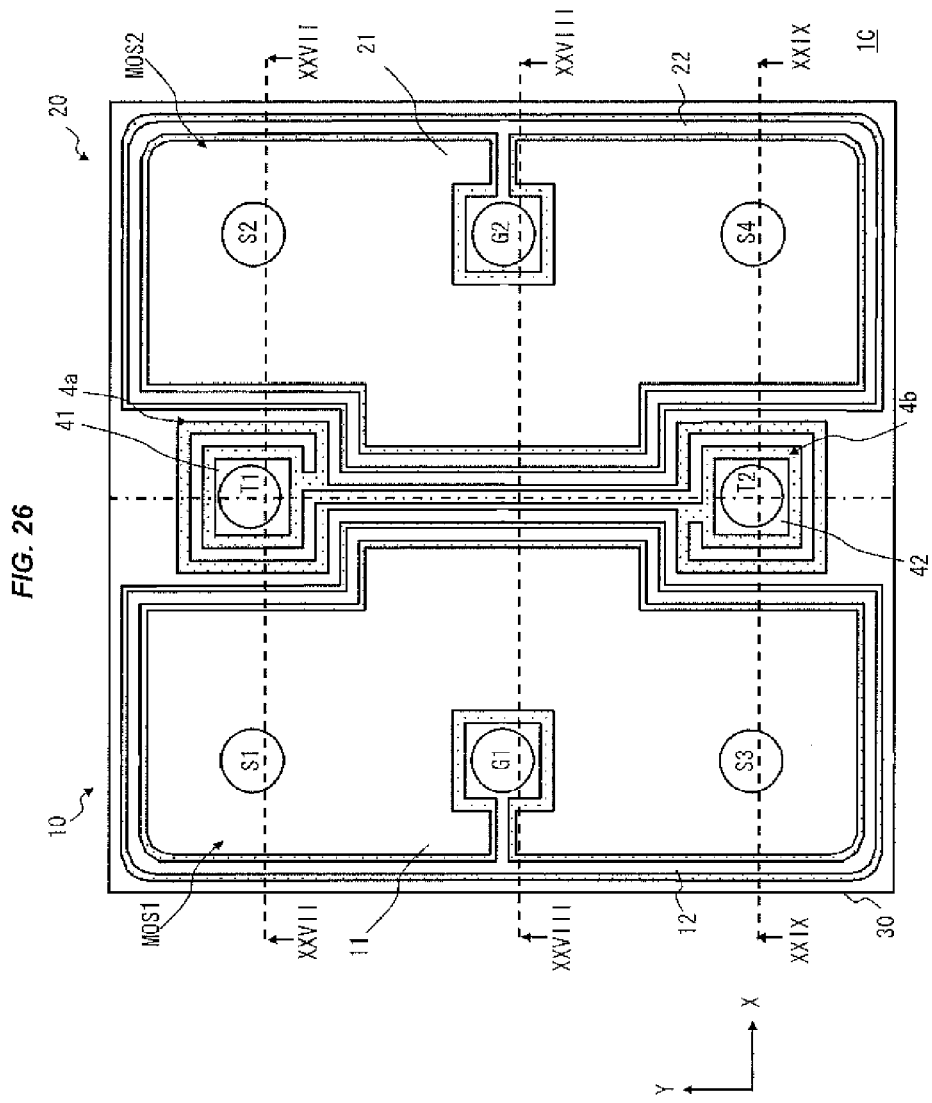
FIG. 26 is a diagram showing a surface layout of a semiconductor device according to a Sixth Embodiment.

A semiconductor device according to a Sixth Embodiment will be explained with reference to FIG. 26. FIG. 26 is a diagram showing a surface layout of a semiconductor device 1C according to the Sixth Embodiment. In the Sixth Embodiment, a different point from the Fifth Embodiment is the point where the temperature detection diode 4 is formed in a distributed manner in the lower portions of the anode terminal T1 and the cathode terminal T2. In the Sixth Embodiment, the same symbol is attached to the same component as in the above-mentioned embodiments, and explanation thereof is omitted. In FIG. 26, a boundary line of the first region 10 and the second region 20 is shown by a dashed line.

As shown in FIG. 26, in the Sixth Embodiment, there are provided eight terminals of the source terminals S1, S2, S3, and S4, the gate terminals G1 and G2, the anode terminal T1, and the cathode terminal T2. Arrangement of these terminals is the same as in the Fifth Embodiment shown in FIG. 22.

The anode terminal T1 is arranged at an intersection of a straight line connecting the source terminal S1 and the source terminal S2, and a boundary line of the MOS1 and the MOS2. A temperature detection diode 4a that is a part of the temperature detection diode 4 is arranged under the anode terminal T1, with the anode terminal T1 being as a center. In addition, the cathode terminal T2 is arranged at an intersection of a straight line connecting the source terminal S3 and the source terminal S4, and the boundary line of the MOS1 and the MOS2. A temperature detection diode 4b that is the other portion of the temperature detection diode 4 is arranged under the cathode terminal T2, and the protection diode 9 is not arranged unlike the Fifth Embodiment.

Figure 27:
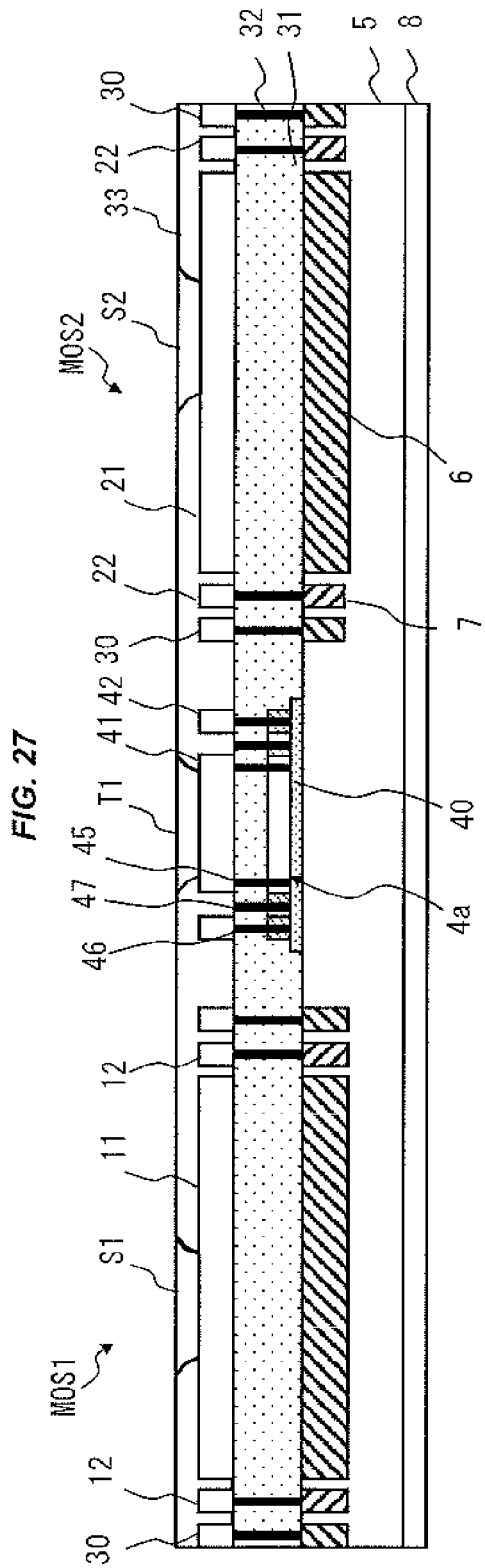
FIG. 27 is a cross-sectional diagram of the semiconductor device taken along a line XXVII-XXVII shown in FIG. 26.

FIG. 27 is a cross-sectional diagram of the semiconductor device 10 taken along a line XXVII-XXVII shown in FIG. 26. The cross-sectional diagram shown in FIG. 27 is substantially the same as the cross-sectional diagram shown in FIG. 3. While the four-stage diode is arranged under the anode terminal T1 in the First Embodiment, the temperature detection diode 4a including two-stage diode is arranged in the Sixth Embodiment.

Figure 28:
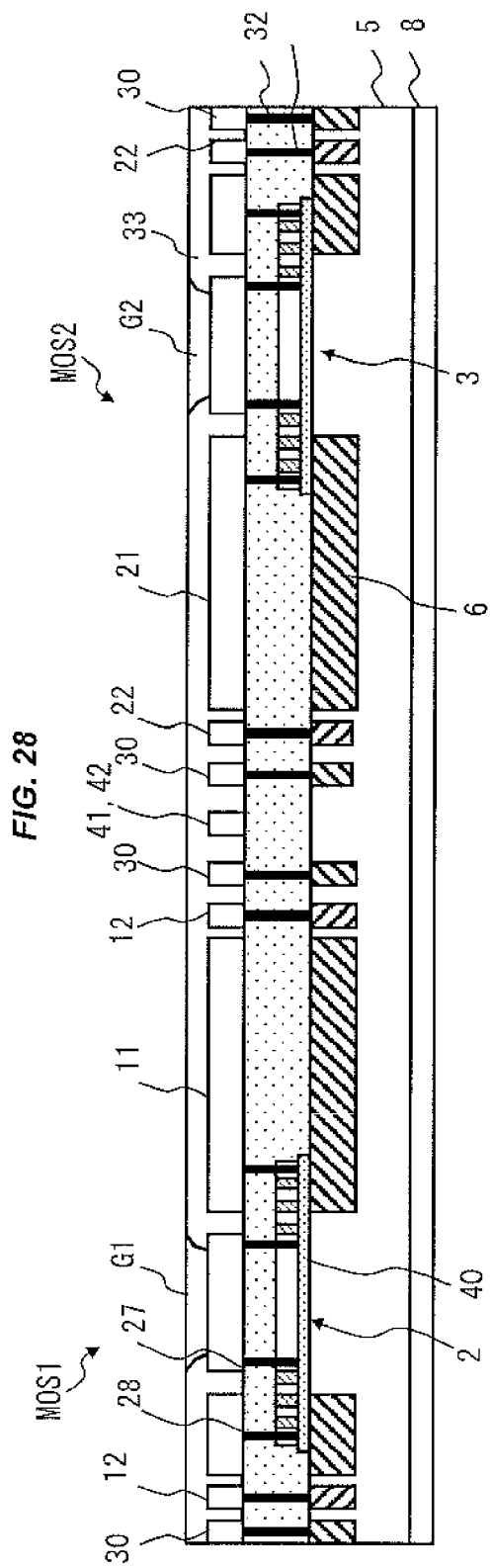
FIG. 28 is a cross-sectional diagram of the semiconductor device taken along a line XXVIII-XXVIII shown in FIG. 26.

FIG. 28 is a cross-sectional diagram of the semiconductor device 10 taken along a line XXVIII-XXVIII shown in FIG. 26. In the Sixth Embodiment, no terminal is provided between the gate terminals G1 and G2. The bidirectional Zener diodes 2 and 3 are provided under the gate terminals G1 and G2, respectively. This configuration is the same as the configuration explained in the First Embodiment.

Figure 29:
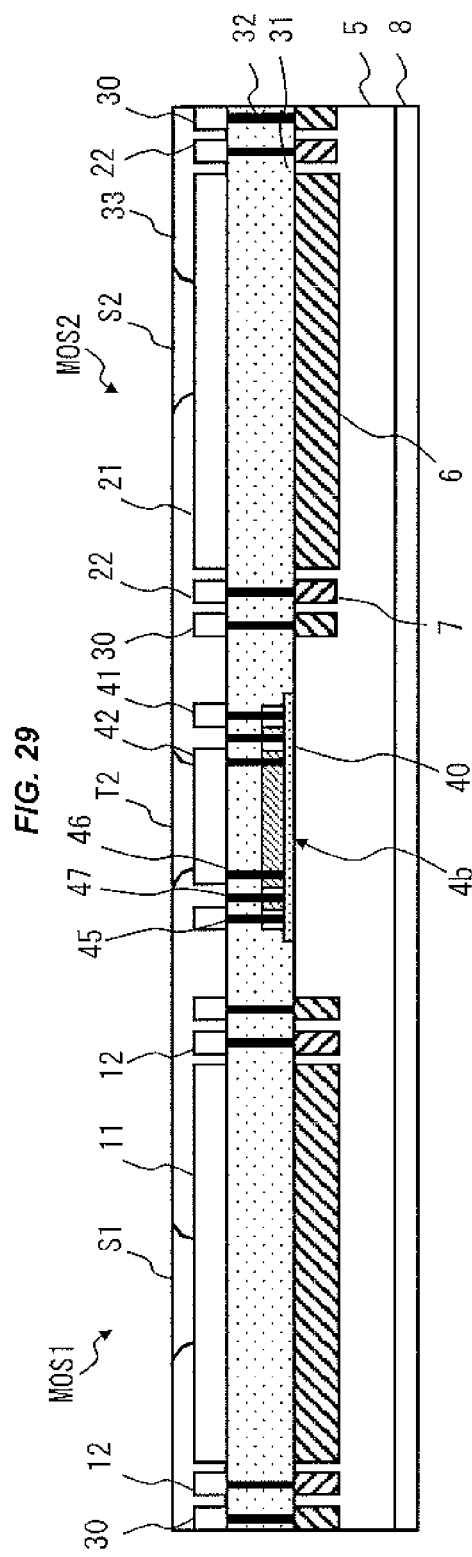
FIG. 29 is a cross-sectional diagram of the semiconductor device taken along a line XXIX-XXIX shown in FIG. 26.

FIG. 29 is a cross-sectional diagram of the semiconductor device 10 taken along a line XXIX-XXIX shown in FIG. 26. As shown in FIG. 29, the temperature detection diode 4b including two-stage diode is arranged under the cathode terminal T2. In the Sixth Embodiment, two stages of diodes are arranged at lower portions of the anode terminal T1 and the cathode terminal T2, respectively, and these four stages of diodes constitute the temperature detection diode 4. As described above, the temperature detection diode 4 is formed in a distributed manner at the lower portion of the anode terminal T1 and the lower portion of the cathode terminal T2, and thus an area of the temperature detection diode 4 can be decreased.

Seventh Embodiment

Figure 30:
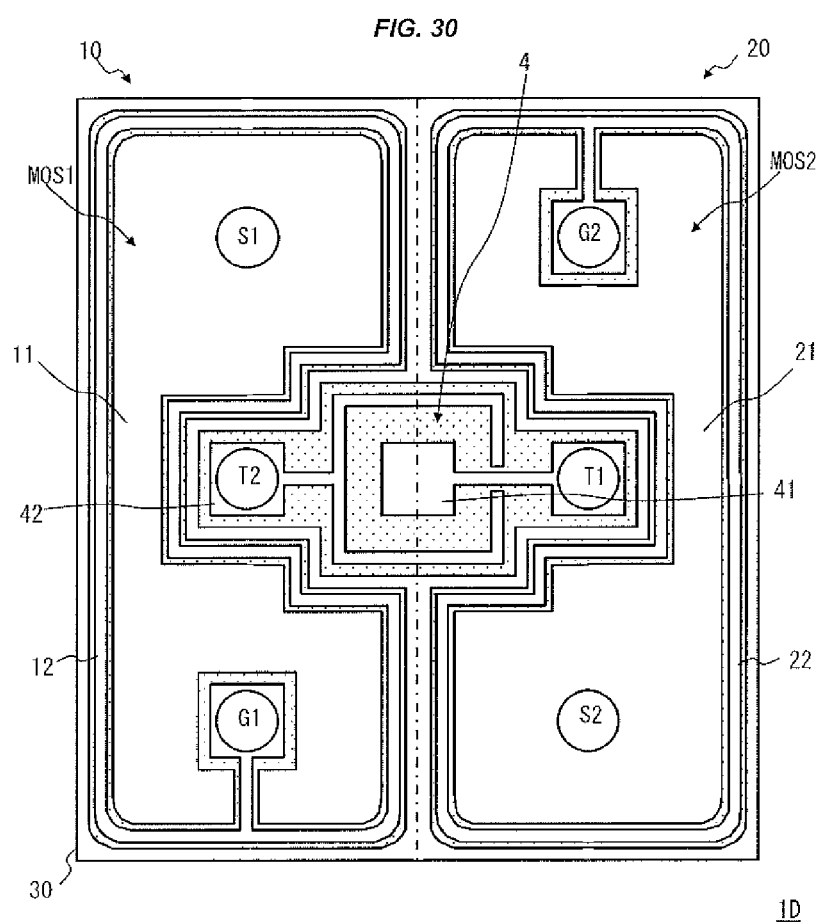
FIG. 30 is a diagram showing a surface layout of a semiconductor device according to a Seventh Embodiment.

A semiconductor device according to a Seventh Embodiment will be explained with reference to FIG. 30. FIG. 30 is a diagram showing a surface layout of a semiconductor device 1D according to the Seventh Embodiment. In FIG. 30, a boundary line of the first region 10 and the second region 20 is shown by a dashed line. As shown in FIG. 30, the source terminal S1 and the gate terminal G2 are arranged facing each other while sandwiching the boundary line of the first region 10 and the second region 20. In addition, the gate terminal G1 and the source terminal S2 are arranged facing each other while sandwiching the boundary line of the first region 10 and the second region 20. That is, the source terminal S1 and the source terminal S2 are diagonally arranged, and the gate terminal G1 and the gate terminal G2 are diagonally arranged.

In the present embodiment, the anode terminal T1 corresponds to the second terminal, and the cathode terminal T2 corresponds to the first terminal. The anode terminal T1 and the cathode terminal T2 are arranged facing each other while sandwiching the boundary line of the first region 10 and the second region 20. That is, a direction in which the anode terminal T1 and the cathode terminal T2 are aligned is an X direction substantially perpendicular to a Y direction in which the source terminal S1 and the gate terminal G1 are aligned, and substantially perpendicular to the Y direction in which the source terminal S2 and the gate terminal G2 are aligned.

Over the first region 10, the cathode terminal T2 is arranged between the source terminal S1 and the gate terminal G1. Over the second region 20, the anode terminal T1 is arranged between the source terminal S2 and the gate terminal G2. The temperature detection diode 4 is formed over an intersection of a straight line that passes through the source terminal S1 and the source terminal S2, and the boundary line of the first region 10 and the second region 20. Note that a configuration of the temperature detection diode 4 is the same as the one shown in FIG. 5.

In the semiconductor device 1D having the present configuration, a current path is formed in a direction of the source terminal S2 via the drain electrode 8 of the back surface from the source terminal S1. The temperature detection diode 4 is laid out over the straight line passing through the source terminal S1 and the source terminal S2, in both of which the largest amount of current flows. Because of this, it becomes possible to more accurately detect rise in temperature when the abnormal current flows.

Eighth Embodiment

Figure 31:
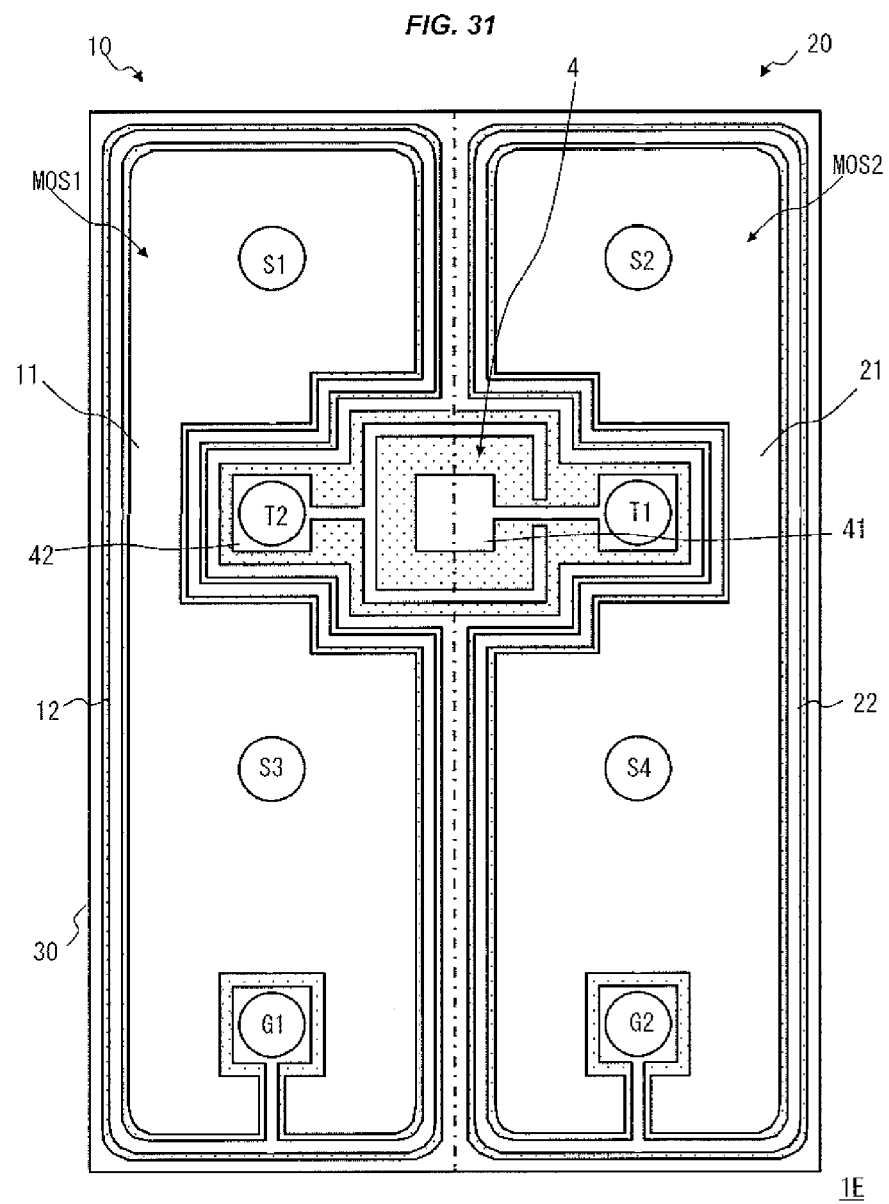
FIG. 31 is a diagram showing a surface layout of a semiconductor device according to an Eighth Embodiment.

A semiconductor device according to an Eighth Embodiment will be explained with reference to FIG. 31. FIG. 31 is a diagram showing a surface layout of a semiconductor device 1E according to the Eighth Embodiment. In FIG. 31, a boundary line of the first region 10 and the second region 20 is shown by a dashed line. As shown in FIG. 31, in the Eighth Embodiment, there are provided eight terminals of the source terminals S1, S2, S3, and S4, the gate terminals G1 and G2, the anode terminal T1, and the cathode terminal T2. In the present embodiment, the anode terminal T1 corresponds to the second terminal, and the cathode terminal T2 corresponds to the first terminal.

In the first region 10, the source terminal S1, the cathode terminal T2, the source terminal S3, and the gate terminal G1 are arranged so as to be aligned in this order at substantially regular intervals. In the second region 20, the source terminal S2, the anode terminal T1, the source terminal S4, and the gate terminal G2 are arranged so as to be aligned in this order at substantially regular intervals. The source terminal S1 and the source terminal S2, the cathode terminal T2 and the anode terminal T1, the source terminal S3 and the source terminal S4, and the gate terminal G1 and the gate terminal G2 are respectively arranged facing each other while sandwiching the boundary of the first region 10 and the second region 20.

A direction in which the anode terminal T1 and the cathode terminal T2 are aligned is an X direction substantially perpendicular to a Y direction in which the source terminal S1 and the gate terminal G1 are aligned, and substantially perpendicular to the Y direction in which the source terminal S2 and the gate terminal G2 are aligned. The temperature detection diode 4 is arranged under an intersection of a straight line that passes through the source terminal S1 and the source terminal S4, and a straight line that passes through the source terminal S3 and the source terminal S2. Note that a configuration of the temperature detection diode 4 is the same as the one shown in FIG. 5. Also in the present embodiment, the temperature detection diode 4 is laid out between the source terminals in which the largest amount of current flows. Because of this, it becomes possible to more accurately detect a rise in temperature when the abnormal current flows.

Hereinbefore, although the invention made by the present inventors have been specifically explained on the basis of the embodiments, it is needless to say that the present invention is not limited to the previously mentioned embodiments and can be modified variously within the scope not departing from the gist thereof. For example, although the examples in which aluminum is used as a material of the wirings such as the source wire and the gate wire have been explained in the above-mentioned explanation, the material of the wirings is not limited to aluminum, but it may be an other material such as copper, or alloy including one of aluminum and copper.

Although a part or all of the above-described embodiments can also be described as the following appendixes, it is not limited to the following.

APPENDIX 1

A semiconductor device including:
a chip including a first MOSFET formed in a first region, and a second MOSFET formed in a second region;
a common drain electrode of the first MOSFET and the second MOSFET, which is formed on a back surface of the chip;
a first source terminal and a first gate terminal of the first MOSFET, which are formed on a surface of the chip in the first region;
a second source terminal and a second gate terminal of the second MOSFET, which are formed at the surface of the chip in the second region, and which are arranged so as to be aligned substantially parallel to a direction in which the first source terminal and the first gate terminal are aligned;
a diode that is formed between the first source terminal and the second source terminal; and
a first terminal and a second terminal of the diode, which are arranged so as to be aligned in a first direction substantially parallel to a direction in which the first source terminal and the first gate terminal are aligned.

APPENDIX 2

The semiconductor device according to Appendix 1,
the first source terminal and the second source terminal arranged facing each other while sandwiching a boundary of the first region and the second region;
the first gate terminal and the second gate terminal arranged facing each other while sandwiching the boundary of the first region and the second region;
the first terminal formed between the first source terminal and the second source terminal;
the second terminal formed between the first gate terminal and the second gate terminal; and
the diode provided at a lower portion of the first terminal.

APPENDIX 3

A semiconductor device including:
a chip including a first MOSFET formed in a first region, and a second MOSFET formed in a second region;
a common drain electrode of the first MOSFET and the second MOSFET, which is formed on a back surface of the chip;
a first source terminal and a first gate terminal of the first MOSFET, which are formed on a surface of the chip in the first region;
a second source terminal and a second gate terminal of the second MOSFET, which are formed at the surface of the chip in the second region, and which are arranged so as to be aligned substantially parallel to a direction in which the first source terminal and the first gate terminal are aligned;
a diode that is formed between the first source terminal and the second source terminal; and
a first terminal and a second terminal of the diode, which are arranged so as to be aligned substantially perpendicular to a direction in which the first source terminal and the first gate terminal are aligned,
in which the first terminal is arranged so as to be sandwiched between the first source terminal and the first gate terminal over the first region; and
in which the second terminal is arranged so as to be sandwiched between the second source terminal and the second gate terminal over the second region.

APPENDIX 4

The semiconductor device according to Appendix 3,
in which the first source terminal and the second gate terminal are arranged facing each other while sandwiching a boundary of the first region and the second region,
in which the first gate terminal and the second source terminal are arranged facing each other while sandwiching the boundary of the first region and the second region, and
in which the diode is arranged between the first region and the second region.

What is claimed is:
1. A semiconductor device comprising:
a chip comprising a first MOSFET formed in a first region, and a second MOSFET formed in a second region;
a common drain electrode of the first MOSFET and the second MOSFET, which is formed on a back surface of the chip;
a first source terminal and a first gate terminal of the first MOSFET, which are formed on a surface of the chip in the first region;
a second source terminal and a second gate terminal of the second MOSFET, which are formed at the surface of the chip in the second region, and which are arranged so as to be aligned substantially parallel to a direction in which the first source terminal and the first gate terminal are aligned;
a diode that is arranged between the first source terminal and the second source terminal; and
a first terminal and a second terminal of the diode, which are arranged so as to be aligned in a first direction substantially parallel to the direction in which the first source terminal and the first gate terminal are aligned, or in a second direction substantially perpendicular thereto.
2. The semiconductor device according to claim 1,
wherein when a direction in which the first terminal and the second terminal are aligned is the first direction, the first terminal and the second terminal are formed between the first region and the second region.
3. The semiconductor device according to claim 2,
wherein the diode is formed at a lower portion of the first terminal.
4. The semiconductor device according to claim 2,
wherein the diode is formed to be divided into the lower portion of the first terminal and a lower portion of the second terminal.
5. The semiconductor device according to claim 2,
wherein the first source terminal and the second source terminal are arranged facing each other while sandwiching a boundary of the first region and the second region,
wherein the first gate terminal and the second gate terminal are arranged facing each other while sandwiching the boundary of the first region and the second region,
wherein the first terminal is formed between the first source terminal and the second source terminal, and
wherein the second terminal is formed between the first gate terminal and the second gate terminal.

6. The semiconductor device according to claim 5,
wherein a distance between the first source terminal and the first terminal, and a distance between the second source terminal and the first terminal are substantially equal to each other, and
wherein a distance between the first gate terminal and the second terminal, and a distance between the second gate terminal and the second terminal are substantially equal to each other.

7. The semiconductor device according to claim 6,
wherein a distance between the first source terminal and the first gate terminal, a distance between the second source terminal and the second gate terminal, and a distance between the first terminal and the second terminal are substantially equal to one another.

8. The semiconductor device according to claim 2, further comprising a protection diode coupled in parallel with the diode and coupled with opposing polarities.

9. The semiconductor device according to claim 8,
wherein the diode is formed at a lower portion of the first terminal, and
wherein the protection diode is formed at a lower portion of the second terminal.

10. The semiconductor device according to claim 1,
wherein when a direction in which the first terminal and the second terminal are aligned is the second direction,
the diode is formed between the first region and the second region, and
the first terminal is formed over the first region, and the second terminal is formed over the second region.

11. The semiconductor device according to claim 10,
wherein the first terminal is arranged so as to be sandwiched between the first source terminal and the first gate terminal, and
wherein the second terminal is arranged so as to be sandwiched between the second source terminal and the second gate terminal.

12. The semiconductor device according to claim 1,
wherein the first source terminal and the second gate terminal are arranged facing each other while sandwiching a boundary of the first region and the second region,
wherein the first gate terminal and the second source terminal are arranged facing each other while sandwiching the boundary of the first region and the second region, and
wherein the diode is arranged between the first region and the second region.

13. The semiconductor device according to claim 1,
wherein the diode is concentrically configured, with the first terminal being as a center.

14. The semiconductor device according to claim 13,
wherein the diode comprises:
a plurality of connection structures including a first conductive type semiconductor layer and a second conductive type semiconductor layer; and
a plurality of contact metals formed between adjacent connection structures, for forming the diode.

15. The semiconductor device according to claim 14,
wherein the first conductive type semiconductor layer comprising:
a first impurity concentration region formed on a second conductive type semiconductor layer side; and
a second impurity concentration region that is formed on a contact side, and that has a higher impurity concentration than in the first impurity concentration region.

16. The semiconductor device according to claim 14,
wherein a contact metal from among the plurality of contact metals has a height substantially equal to that of the first conductive type semiconductor layer and the second conductive type semiconductor layer.

17. The semiconductor device according to claim 1,
wherein a bidirectional Zener diode is provided between gates and sources of the first MOSFET and the second MOSFET, respectively.

18. A method of manufacturing a semiconductor device, the method comprising:
forming a first MOSFET in a first region of a chip, and forming a second MOSFET in a second region thereof;
forming a common drain electrode of the first MOSFET and the second MOSFET, on a back surface of the chip;
arranging a first source terminal and a first gate terminal of the first MOSFET, on a surface of the chip in the first region;
arranging a second source terminal and a second gate terminal of the second MOSFET, on the surface of the chip in the second region, so as to be aligned substantially parallel to a direction in which the first source terminal and the first gate terminal are aligned;
arranging a diode between the first source terminal and the second source terminal; and
arranging a first terminal and a second terminal of the diode so as to be aligned in a first direction substantially parallel to a direction in which the first source terminal and the first gate terminal are aligned, or in a second direction substantially perpendicular thereto.

19. The method of manufacturing the semiconductor device according to claim 18, the method further comprising:
forming, along with formation of the diode, a protection diode coupled in parallel with the diode and in a direction opposite thereto, between the first MOSFET and the second MOSFET.

20. The method of manufacturing the semiconductor device according to claim 18, the method further comprising:
forming, along with formation of the diode, a bidirectional Zener diode, between gates and sources of the first MOSFET and the second MOSFET, respectively.

* * * * *

UNITED STATES PATENT AND TRADEMARK OFFICE
CERTIFICATE OF CORRECTION

| | |
|---|---|
| PATENT NO. | : 9,024,412 B2 |
| APPLICATION NO. | : 13/952869 |
| DATED | : May 5, 2015 |
| INVENTOR(S) | : Fumio Tonomura et al. |

It is certified that error appears in the above-identified patent and that said Letters Patent is hereby corrected as shown below:

IN THE SPECIFICATION

Column 2, Line 29: After "line" insert -- III-III --

Column 14, Line 22: Delete "13" and insert -- 1B --

Column 14, Line 25: After "and" insert -- 3 --

Signed and Sealed this
Seventeenth Day of November, 2015

Michelle K. Lee
*Director of the United States Patent and Trademark Office*